(12) United States Patent
Ichioka

(10) Patent No.: US 11,294,283 B2
(45) Date of Patent: Apr. 5, 2022

(54) PHOTOSENSITIVE RESIN COMPOSITION, PHOTOSENSITIVE RESIN LAMINATE, AND PATTERN FORMING PROCESS

(71) Applicant: Shin-Etsu Chemical Co., Ltd., Tokyo (JP)

(72) Inventor: Yoichiro Ichioka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 127 days.

(21) Appl. No.: 16/299,702

(22) Filed: Mar. 12, 2019

(65) Prior Publication Data

US 2019/0294045 A1 Sep. 26, 2019

(30) Foreign Application Priority Data

Mar. 23, 2018 (JP) .............................. JP2018-056546

(51) Int. Cl.
| | | |
|---|---|---|
| G03F 7/07 | (2006.01) | |
| G03F 7/075 | (2006.01) | |
| G03F 7/004 | (2006.01) | |
| G03F 7/038 | (2006.01) | |
| G03F 7/105 | (2006.01) | |
| C08G 73/10 | (2006.01) | |
| G03F 7/11 | (2006.01) | |
| G03F 7/115 | (2006.01) | |

(52) U.S. Cl.
CPC .......... *G03F 7/0757* (2013.01); *G03F 7/0045* (2013.01); *G03F 7/0047* (2013.01); *G03F 7/038* (2013.01); *G03F 7/0385* (2013.01); *G03F 7/0387* (2013.01); *G03F 7/105* (2013.01); *C08G 73/106* (2013.01); *G03F 7/0048* (2013.01); *G03F 7/11* (2013.01); *G03F 7/115* (2013.01)

(58) Field of Classification Search
CPC ..... C08G 73/106; G03F 7/0757; G03F 7/038; G03F 7/105; G03F 7/0387; G03F 7/0045; G03F 7/0047; G03F 7/0385; G03F 7/0048; G03F 7/11; G03F 7/115; G03F 7/075; G03F 7/09; G03F 7/0035
See application file for complete search history.

(56) References Cited

U.S. PATENT DOCUMENTS

| | | | | |
|---|---|---|---|---|
| 4,395,482 A * | 7/1983 | Ahne | ................... | G03F 7/0233 430/326 |
| 4,499,149 A * | 2/1985 | Berger | ................. | C07F 7/0889 257/788 |
| 4,829,131 A | 5/1989 | Lee | | |
| 4,853,452 A | 8/1989 | Lee | | |
| 5,554,684 A * | 9/1996 | Choi | ..................... | G03F 7/0387 524/588 |
| 6,100,534 A * | 8/2000 | Honma | ................. | B82Y 35/00 250/442.11 |
| 6,706,841 B2 * | 3/2004 | Sugo | ................... | C08G 77/455 522/148 |
| 7,485,408 B2 * | 2/2009 | Kinsho | ................. | G03F 7/0046 430/270.1 |
| 7,834,100 B2 * | 11/2010 | Yoneda | ................ | C08G 73/106 525/421 |
| 8,053,533 B2 * | 11/2011 | Yoneda | ................ | C08G 73/106 525/423 |
| 8,263,308 B2 * | 9/2012 | Tagami | ................. | G03F 7/0382 430/270.1 |
| 8,673,537 B2 * | 3/2014 | Furuya | ............... | C08G 73/1042 430/270.1 |
| 9,449,856 B2 * | 9/2016 | Nakamura | ............ | H01L 21/561 |
| 2005/0063296 A1 * | 3/2005 | Miyamoto | ......... | G11B 7/24082 369/275.5 |
| 2005/0165135 A1 * | 7/2005 | Mozel | .................. | C09D 11/101 523/440 |
| 2006/0079658 A1 * | 4/2006 | Kato | ..................... | G03F 7/0387 528/43 |
| 2007/0009821 A1 * | 1/2007 | Cutler | ................. | H01L 51/0043 430/81 |
| 2010/0013078 A1 * | 1/2010 | Nagai | .................... | C09J 163/00 257/690 |
| 2011/0151195 A1 * | 6/2011 | Mitsukura | ............. | G03F 7/0388 428/156 |
| 2012/0202015 A1 * | 8/2012 | Ikeda | ........................ | C09J 5/00 428/195.1 |
| 2012/0248632 A1 * | 10/2012 | Mitsukura | ............... | H01L 24/29 257/787 |

(Continued)

FOREIGN PATENT DOCUMENTS

| | | | |
|---|---|---|---|
| JP | 2-36232 A | 2/1990 | |
| JP | 2-147630 A | 6/1990 | |

(Continued)

OTHER PUBLICATIONS

Technical Data Sheet for EPIKOTE 828 from Hexion (revised, 2007). Retrieved on [Oct. 9, 2020]. Retrieved from internet: URL< https://www.hexion.com/en-US/product/epikote-resin-828 > (Year: 2007).*

*Primary Examiner* — Sanza L. McClendon

(74) *Attorney, Agent, or Firm* — Westerman, Hattori, Daniels & Adrian, LLP

(57) ABSTRACT

A photosensitive resin composition is provided comprising 100 pbw of a polyimide silicone containing a primary alcoholic hydroxyl group, a crosslinker, a photoacid generator, a polyfunctional epoxy compound, 1-70 pbw of a filler having an average particle size of 0.01-20.0 μm, and 0.01-30 pbw of a colorant. The resin composition is colored and photosensitive and cures into a product having an improved modulus.

9 Claims, No Drawings

(56) References Cited

U.S. PATENT DOCUMENTS

2016/0160102 A1* 6/2016 Minegishi ............... H01L 24/83
257/783

FOREIGN PATENT DOCUMENTS

| JP | 7-268098 A | | 10/1995 |
|---|---|---|---|
| JP | 2009167381 A | * | 7/2009 |
| JP | 2014070111 A | * | 4/2014 |

* cited by examiner

PHOTOSENSITIVE RESIN COMPOSITION, PHOTOSENSITIVE RESIN LAMINATE, AND PATTERN FORMING PROCESS

CROSS-REFERENCE TO RELATED APPLICATION

This non-provisional application claims priority under 35 U.S.C. § 119(a) on Patent Application No. 2018-056546 filed in Japan on Mar. 23, 2018, the entire contents of which are hereby incorporated by reference.

TECHNICAL FIELD

This invention relates to a photosensitive resin composition, photosensitive resin laminate, and pattern forming process.

BACKGROUND ART

Because of excellent heat resistance and electrical insulating properties, polyimide resins are widely used as printed circuit boards, heat resistant adhesive tape, electric parts, semiconductor material protecting films and interlayer insulating films, and the like. The polyimide resins, however, suffer from a problem of working because they are dissolvable only in limited solvents. It is then a common practice to coat a substrate with a solution of polyamic acid which is relatively soluble in various organic solvents, and treating the polyamic acid at high temperature to form a polyimide resin through dehydrating cyclization. However, this method needs long-term heating at high temperature, which causes thermal deterioration of the substrate. On the other hand, insufficient heating may leave residual polyamic acid in the resin structure, causing a lowering of moisture resistance and corrosion resistance.

To solve the problem, Patent Document 1 proposes a method of forming a polyimide resin film by coating a substrate with a solution of polyimide resin which is soluble in an organic solvent, instead of polyamic acid, and heating the coating to evaporate off the solvent. However, the resin film obtained from the organic solvent-soluble polyimide resin is poor in solvent resistance. Then Patent Documents 2 and 3 disclose silicone-modified polyimides (also known as polyimide silicone) of heat cure type having polymerizable side chains and being soluble in organic solvents. Allegedly the resin of Patent Document 2 is curable by thermal or photo means. The resin of Patent Document 3 is cured through hydrosilylation reaction with organohydrogensiloxane, but curing takes 5 hours.

CITATION LIST

Patent Document 1: JP-A H02-036232
Patent Document 2: JP-A H02-147630
Patent Document 3: JP-A H07-268098

SUMMARY OF INVENTION

Under the circumstances, polyimide silicone resin compositions which cure at relatively low temperature within a relatively short time are now used. As compared with conventional polyimide resins, the silicone-modified polyimide resins are soft and have a high coefficient of linear expansion, which is not readily reduced. It is difficult to formulate a resin composition having a high modulus and reliability. In general, high modulus and reliability are guaranteed by incorporating a filler.

However, it is unfavorable to use a filler in a photosensitive resin composition because the filled composition is reduced in light transmittance. Similarly, when a colorant is added to a photosensitive resin composition, the composition is reduced in light transmittance. It is quite difficult to use the filler and colorant at the same time.

An object of the invention is to provide a photosensitive resin composition containing a filler and a colorant, a photosensitive resin laminate, and a pattern forming process using the same.

The inventor attempted to add a filler and colorant to a photosensitive resin composition comprising a polyimide silicone containing a primary alcoholic hydroxyl group, a crosslinker, and a photoacid generator. When the photosensitive resin composition is exposed to light, the photoacid generator generates an acid, which reacts with hydroxyl groups in the resin and the crosslinker to form crosslinking sites. This necessitates to irradiate light to every region to be cured. If the filler and colorant are present, light is scattered or absorbed by them, and so the crosslinking reaction is retarded.

Continuing investigations, the inventor has found that when a predetermined amount of a filler having a specific particle size and a predetermined amount of a colorant are added to a photosensitive resin composition comprising a polyimide silicone containing a primary alcoholic hydroxyl group, a crosslinker, a photoacid generator, and a polyfunctional epoxy compound, there is obtained a resin composition which is colored and photosensitive and cures into a product having an improved modulus.

In one aspect, the invention provides a photosensitive resin composition comprising:

(A) a polyimide silicone containing $1.0 \times 10^{-7}$ to $8.0 \times 10^{-3}$ eq/g of primary alcoholic hydroxyl group, (B) a crosslinker, (C) a photoacid generator, (D) a polyfunctional epoxy compound, (E) a filler having an average particle size of 0.01 to 20.0 μm, in an amount of 1 to 70 parts by weight per 100 parts by weight of the polyimide silicone (A), and (F) a colorant in an amount of 0.01 to 30 parts by weight per 100 parts by weight of the polyimide silicone (A).

The composition may further comprise (G) an organic solvent. Preferably, the organic solvent is selected from the group consisting of propylene glycol monomethyl ether acetate, propylene glycol monomethyl ether, ethyl lactate, cyclohexanone, cyclopentanone, methyl isobutyl ketone, and γ-butyrolactone.

In a preferred embodiment, the polyimide silicone (A) comprises recurring units having the formula (1-1) and recurring units having the formula (1-2):

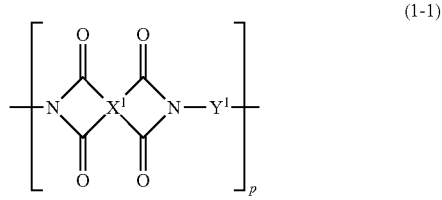

-continued

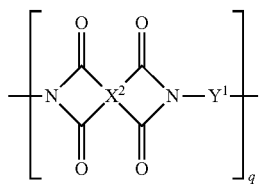
(1-2)

wherein $X^1$ is a tetravalent group having the formula (2):

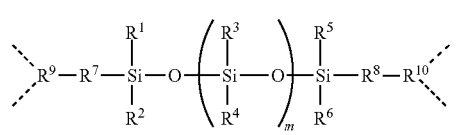
(2)

wherein $R^1$ to $R^6$ are each independently a $C_1$-$C_8$ monovalent hydrocarbon group, $R^7$ and $R^8$ are each independently a single bond or $C_1$-$C_{12}$ divalent hydrocarbon group, $R^9$ and $R^{10}$ are each independently a trivalent organic group, m is an integer of 0 to 120, the broken line denotes a valence bond, $Y^1$ is a group having the formula (3):

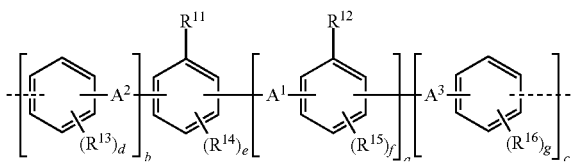
(3)

wherein $A^1$ to $A^3$ are each independently a single bond, methylene group, ether bond, sulfonyl group, amide bond, propane-2,2-diyl, 1,1,1,3,3,3-hexafluoropropane-2,2-diyl, or fluorene-9,9-diyl group, $R^{11}$ and $R^{12}$ are each independently a hydroxyl group or alcoholic hydroxyl-containing organic group, at least one of $R^{11}$ and $R^{12}$ being a primary alcoholic hydroxyl-containing organic group, $R^{13}$ to $R^{16}$ are each independently a $C_1$-$C_4$ alkyl group, a is an integer of 0 to 10, b and c are each independently 0 or 1, d to g are each independently 0, 1 or 2, $X^2$ is a tetravalent organic group other than the group of formula (2), p and q are positive integers, meeting $0.01 \leq p/(p+q) < 1$, the broken line denotes a valence bond.

Preferably, $X^2$ is a group selected from the following:

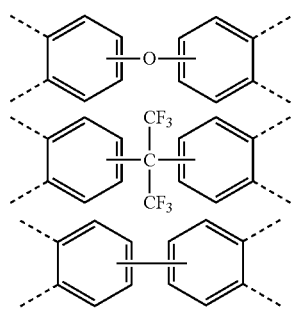

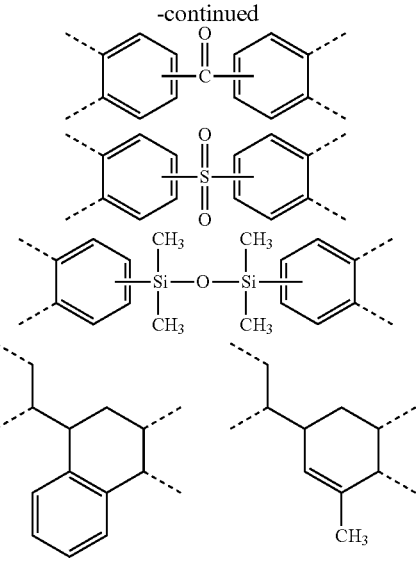

wherein the broken line denotes a valence bond.

Typically, the colorant (F) is carbon black.

Preferably, component (D) comprises at least one compound selected from the group consisting of a bisphenol skeleton-bearing polyfunctional epoxy compound, phenol novolak polyfunctional epoxy compound, and polyfunctional epoxy silicone.

In another aspect, the invention provides a photosensitive resin laminate comprising a support film layer, a photosensitive resin layer composed of the photosensitive resin composition of any one of claims 1 to 7, and a cover film layer.

In a further aspect, the invention provides a pattern forming process comprising the steps of:

(i) forming a photosensitive resin film on a substrate using the photosensitive resin composition defined above, (ii) exposing the resin film to radiation, and (iii) developing the resin film in a developer; or (i) forming a photosensitive resin film on a substrate using the photosensitive resin laminate defined above, (ii) exposing the resin film to radiation, and (iii) developing the resin film in a developer.

Advantageous Effects of Invention

The photosensitive resin composition cures into a product having a high modulus and a relatively low coefficient of linear expansion and remaining highly reliable. The cured product also has excellent heat resistance, mechanical strength, solvent resistance, and adhesion to various substrates. Since the photosensitive resin composition maintains flexibility in B-stage, it may be processed into a film. Since the colorant is included, the cured product is amenable to laser marking.

DESCRIPTION OF PREFERRED EMBODIMENTS

As used herein, the notation (Cn-Cm) means a group containing from n to m carbon atoms per group. In chemical formulae, the broken line denotes a valence bond.

The invention provides a photosensitive resin composition comprising (A) a polyimide silicone, (B) a crosslinker, (C) a photoacid generator, (D) a polyfunctional epoxy compound, (E) a filler, and (F) a colorant.

(A) Polyimide Silicone

Component (A) is a polyimide silicone containing $1.0 \times 10^{-7}$ to $8.0 \times 10^{-3}$ eq/g of primary alcoholic hydroxyl group. If the content of primary alcoholic hydroxyl group is outside the range, the resin film may strip from the substrate and the resin film in unexposed region is difficultly dissolved during development. As used herein, the "primary alcoholic hydroxyl group" refers to a hydroxyl group bonded to a primary carbon atom. That is, the polyimide silicone (A) has a primary alcohol structure.

Preferably, the polyimide silicone comprises recurring units having the formula (1-1) and recurring units having the formula (1-2).

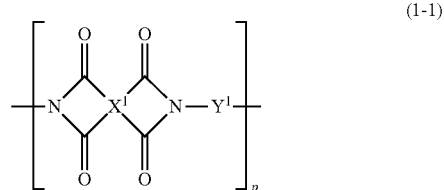
(1-1)

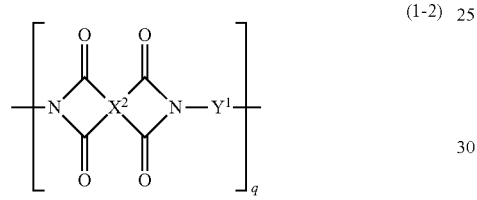
(1-2)

In formula (1-1), $X^1$ is a tetravalent group having the formula (2). The inclusion of recurring units having formula (1-1) renders the polymer backbone skeleton pliable and imparts flexibility to the resin itself

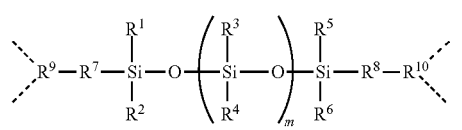
(2)

In formula (2), $R^1$ to $R^6$ are each independently a $C_1$-$C_8$ monovalent hydrocarbon group. The monovalent hydrocarbon group may be straight, branched or cyclic. Examples include alkyl groups such as methyl, ethyl, propyl, butyl, pentyl and hexyl, cycloalkyl groups such as cyclopentyl and cyclohexyl, aryl groups such as phenyl, aralkyl groups such as benzyl and phenethyl, and alkenyl groups such as vinyl, allyl, propenyl, isopropenyl and butenyl. Inter alia, methyl, ethyl, phenyl and vinyl are preferred for availability of reactants.

In formula (2), $R^7$ and $R^8$ are each independently a single bond or $C_1$-$C_{12}$ divalent hydrocarbon group. The divalent hydrocarbon group may be straight, branched or cyclic. Examples include methylene, ethane-1,1-diyl, ethane-1,2-diyl, propane-1,3-diyl, butane-1,4-diyl, benzene-1,4-diyl, and biphenyl-4,4'-diyl. Preferably $R^7$ and $R^8$ are a single bond, methylene, ethane-1,2-diyl, propane-1,3-diyl or benzene-1,4-diyl.

In formula (2), $R^9$ and $R^{10}$ are each independently a trivalent organic group, preferably of 2 to 10 carbon atoms. Preferred examples of the trivalent organic group are shown below, but not limited thereto.

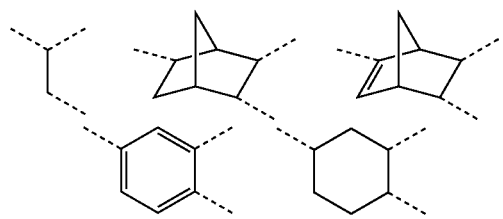

In formula (2), m is an integer of 0 to 120, preferably 3 to 80, more preferably 5 to 50. In the case of m≥2, that is, where two or more siloxane units are included, the siloxane units may be all the same, or of two or more different types. Where siloxane units of two or more different types are included, they may be arranged randomly or alternately, or plural blocks of siloxane units of identical type may be included.

Typical groups of $X^1$ are shown below, but not limited thereto.

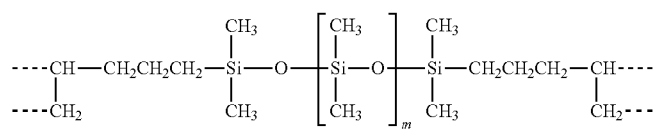

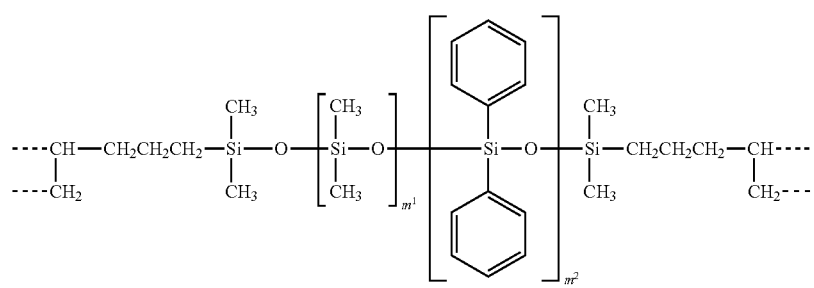

-continued

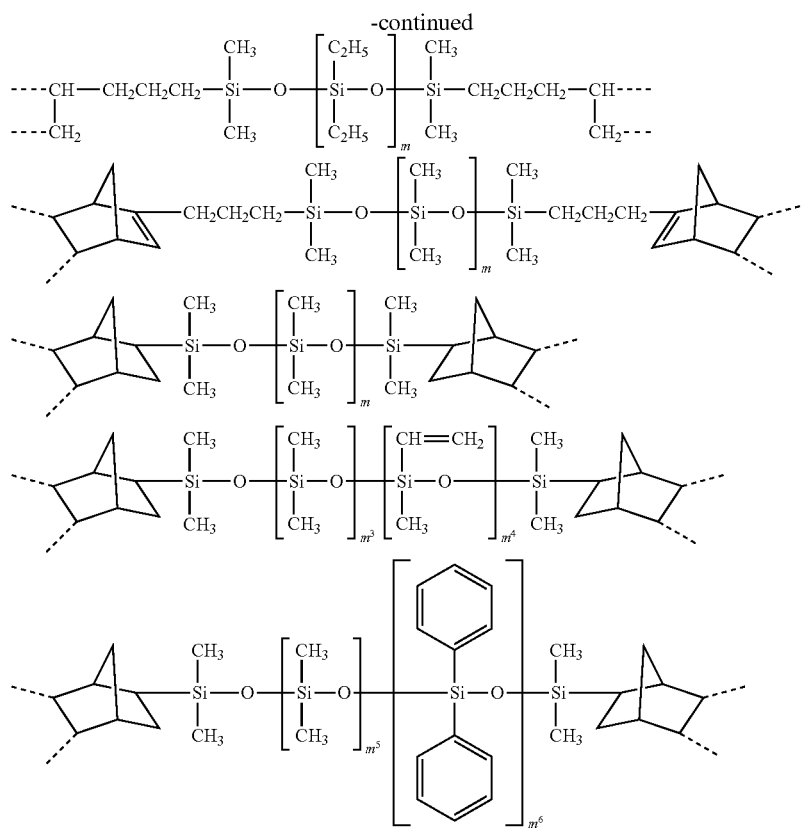

Herein, $m^1$ and $m^2$ are each independently 0 or an integer of at least 1, $m^1+m^2=m$; $m^3$ and $m^4$ are each independently 0 or an integer of at least 1, $m^3+m^4=m$; $m^5$ and $m^6$ are each independently 0 or an integer of at least 1, $m^5+m^6=m$ while m is an integer of 0 to 120 as defined above.

Preferably, units having vinyl and aryl groups are included in a content of 3 to 60% by weight of overall units. Within this range, the silicone portion becomes more compatible and the cured product is improved in breaking strength.

Preferred groups of $X^1$ are shown below.

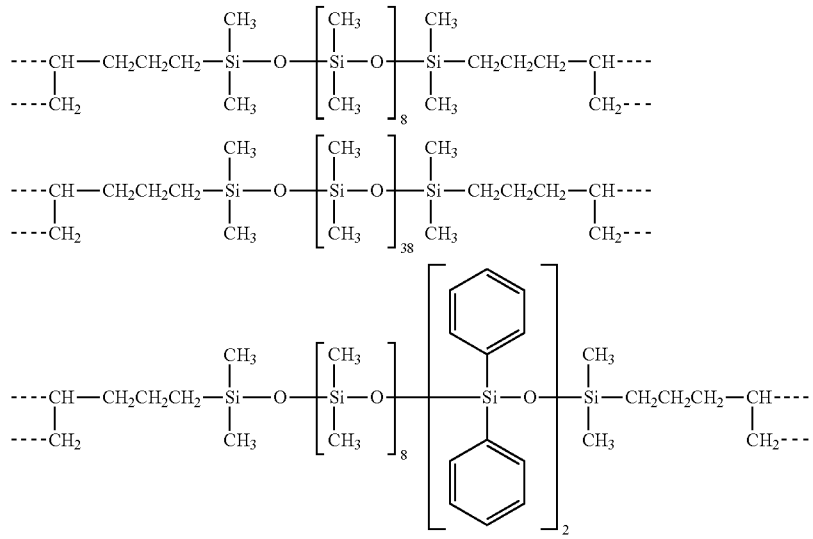

-continued
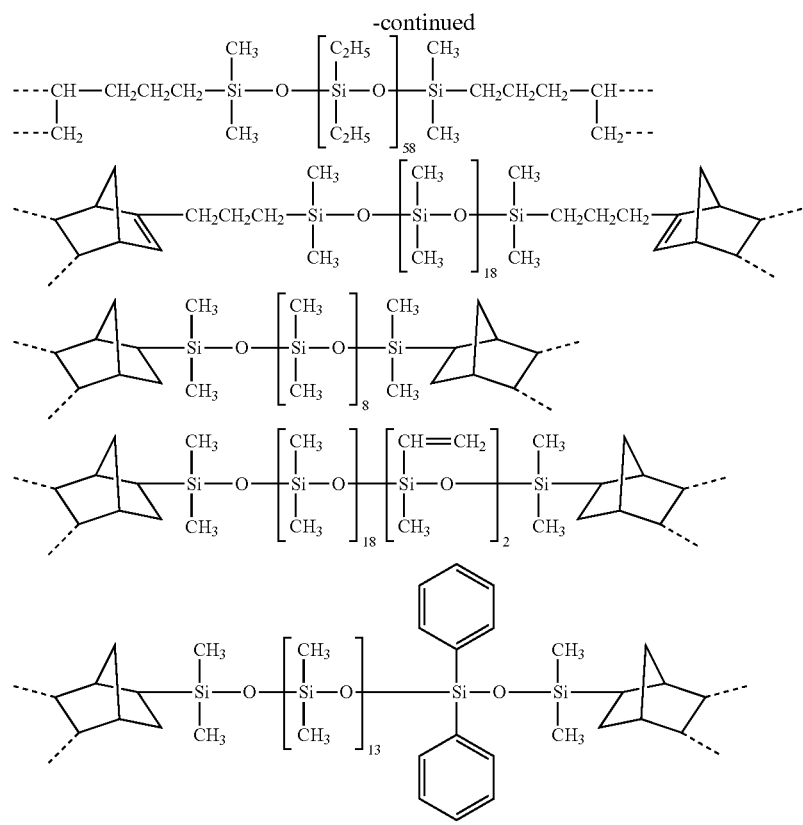
In formula (1-2), $X^2$ is a tetravalent organic group other than the group of formula (2). Preferred groups of $X^2$ are shown below, but not limited thereto.
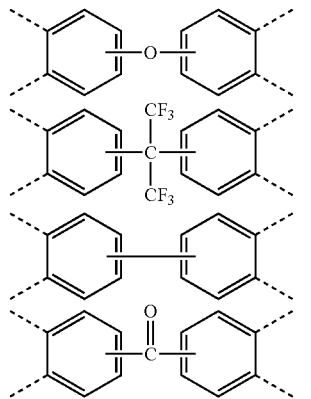
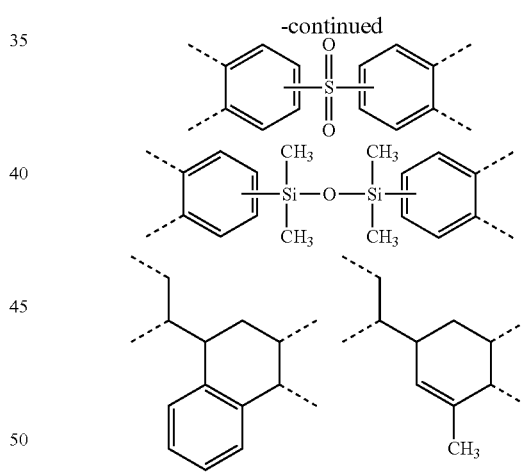
In formulae (1-1) and (1-2), $Y^1$ is a group having the formula (3).
(3)
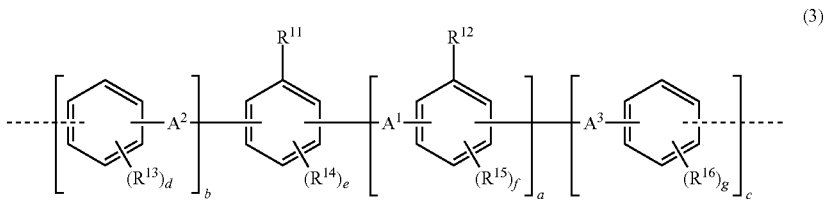

In formula (3), $A^1$ to $A^3$ are each independently a single bond, methylene group, ether bond, sulfonyl group, amide bond, propane-2,2-diyl, 1,1,1,3,3,3-hexafluoropropane-2,2-diyl, or fluorene-9,9-diyl group.

In formula (3), a is an integer of 0 to 10, preferably 1 to 10, b is 0 or 1, and c is 0 or 1.

In formula (3), $R^{11}$ and $R^{12}$ are each independently a hydroxyl group or alcoholic hydroxyl-containing organic group, at least one of $R^{11}$ and $R^{12}$ being a primary alcoholic hydroxyl-containing organic group. Suitable alcoholic hydroxyl-containing organic groups include —OCH$_2$CH(OH)CH$_2$OH and —OCH(CH$_2$OH)CH$_2$OH.

In formula (3), $R^{13}$ to $R^{16}$ are each independently a $C_1$-$C_4$ alkyl group. Suitable alkyl groups include methyl, ethyl, propyl and butyl, with methyl being preferred.

In formula (3), d to g are each independently 0, 1 or 2, preferably 0 or 1.

Examples of the group having formula (3) are shown below, but not limited thereto.

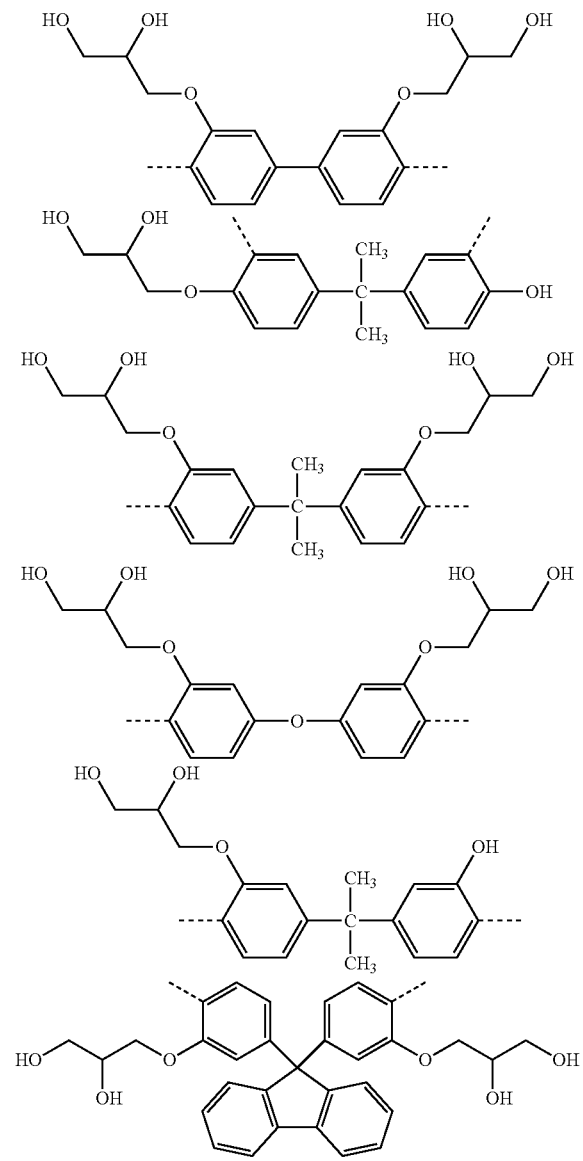

In formulae (1-1) and (1-2), p and q are each independently a positive integer, preferably $1 \leq p \leq 500$ and $1 \leq q \leq 500$, more preferably $3 \leq p \leq 300$ and $3 \leq q \leq 300$, and meet $0.01 \leq p/(p+q) \leq 1$, preferably $0.1 \leq p/(p+q) \leq 1$, more preferably $0.2 \leq p/(p+q) \leq 0.95$, even more preferably $0.5 \leq p/(p+q) \leq 0.9$. If $p/(p+q)$ is less than 0.01, no sufficient flexibility is obtainable.

The polyimide silicone may further comprise recurring units having the formula (1-3) and recurring units having the formula (1-4).

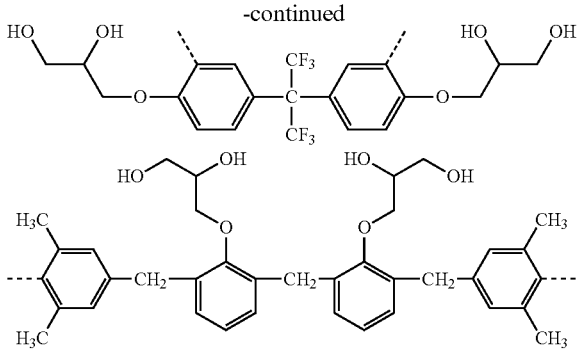

In formulae (1-3) and (1-4), $X^1$ and $X^2$ are as defined above. $Y^2$ is a divalent organic group other than the group having formula (3); r and s are each independently 0 or a positive integer, preferably $0 \leq r \leq 500$ and $0 \leq s \leq 500$, more preferably $0 \leq r \leq 300$ and $0 \leq s \leq 300$. When the polyimide silicone contains recurring units having formula (1-3) and recurring units having formula (1-4), the relationship: $0.01 \leq (p+r)/(p+q+r+s) < 1$ is met.

$Y^2$ is a divalent organic group other than the group of formula (3), that is, a divalent organic group not containing a primary alcoholic hydroxyl group. Of such divalent organic groups, divalent groups having the formula (4) are preferred.

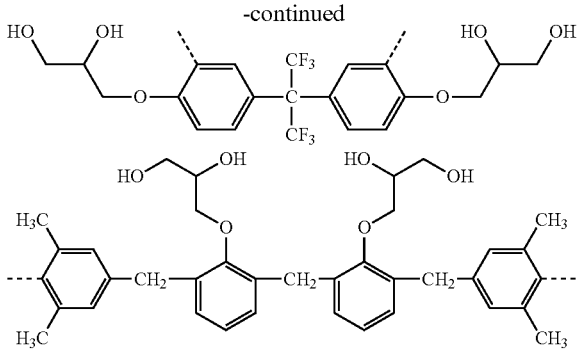

In formula (4), $B^1$ to $B^3$ are each independently a single bond, methylene group, ether bond, sulfonyl group, amide bond, propane-2,2-diyl, 1,1,1,3,3,3-hexafluoropropane-2,2-diyl, or fluorene-9,9-diyl group, j and k are each independently 0 or 1.

Examples of the group having formula (4) are given below, but not limited thereto.

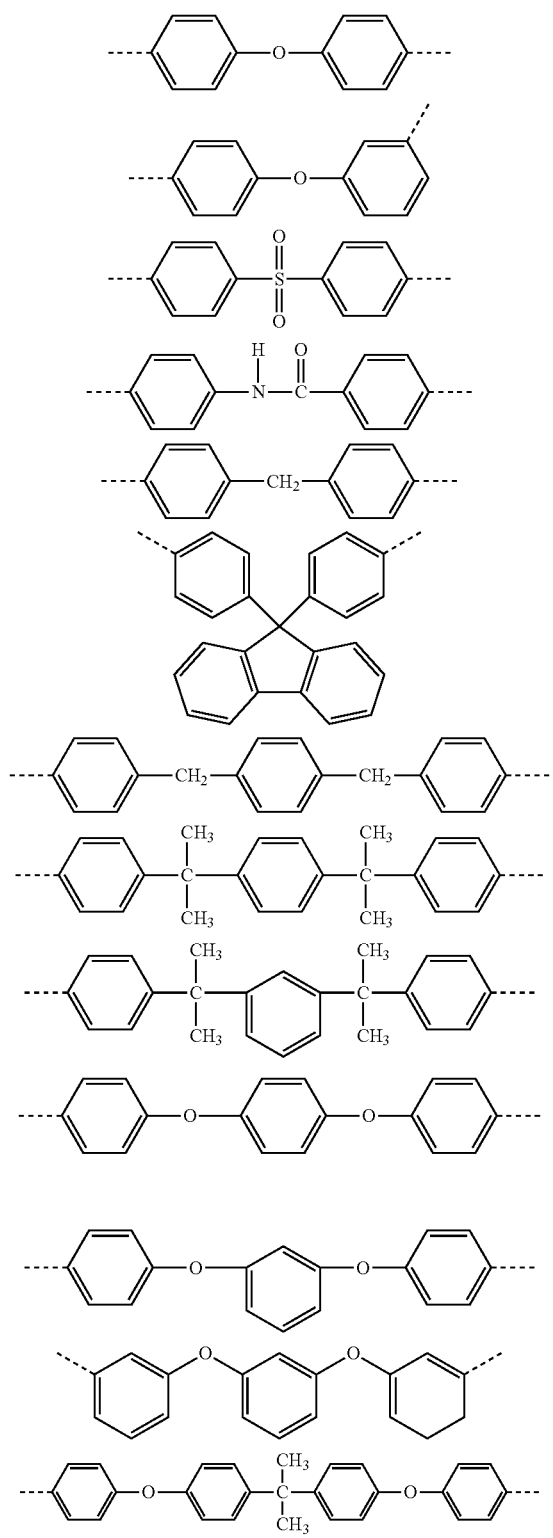

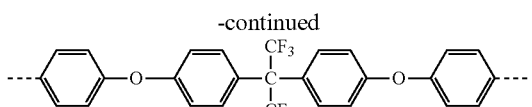

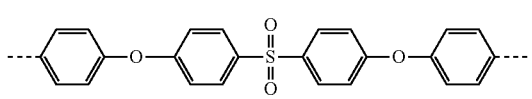

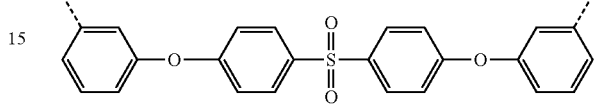

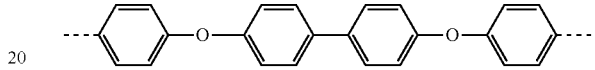

Also preferably, $Y^2$ is a divalent group having the formula (5).

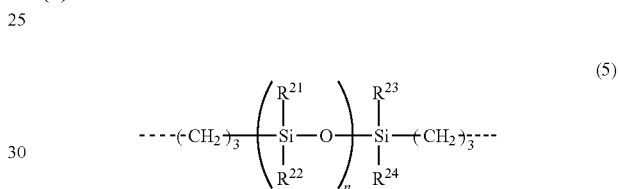

In formula (5), $R^{21}$ to $R^{24}$ are each independently a $C_1$-$C_8$ monovalent hydrocarbon group. The monovalent hydrocarbon group may be straight, branched or cyclic. Examples include alkyl groups such as methyl, ethyl, propyl, butyl, pentyl and hexyl, cycloalkyl groups such as cyclopentyl and cyclohexyl, and aryl groups such as phenyl. Inter alia, methyl and phenyl are preferred for availability of reactants.

In formula (5), n is an integer of 1 to 80, preferably 1 to 20.

The polyimide silicone (A) may be a random or block copolymer. It should preferably have a weight average molecular weight (Mw) of 2,000 to 200,000, more preferably 4,000 to 100,000. A polymer with a Mw in the range is easy to handle and cures into a product having a sufficient strength.

The polyimide silicone (A) may be prepared by first reacting a diamine having a phenolic hydroxyl group with an acid anhydride-modified silicone, an acid dianhydride, and optionally a diamine free of phenolic hydroxyl group and carboxyl group to form a polyamic acid.

Examples of the diamine having a phenolic hydroxyl group include phenol-containing diamines such as 3,3'-diamino-4,4'-dihydroxybiphenyl, 2,2'-diamino-4,4'-dihydroxybiphenyl, 2,2-bis(4-amino-3-hydroxyphenyl)propane, 2,2-bis(3-amino-4-hydroxyphenyl)propane, 9,9-bis(3-amino-4-hydroxyphenyl)fluorene, 2,2'-methylenebis[6-(4-amino-3,5-dimethylbenzyl)-4-methyl]phenol, 3,3'-diamino-4,4'-dihydroxydiphenyl ether, and 2,2-bis(3-amino-4-hydroxyphenyl)hexafluoropropane.

Examples of the acid anhydride-modified silicone are shown below, but not limited thereto.

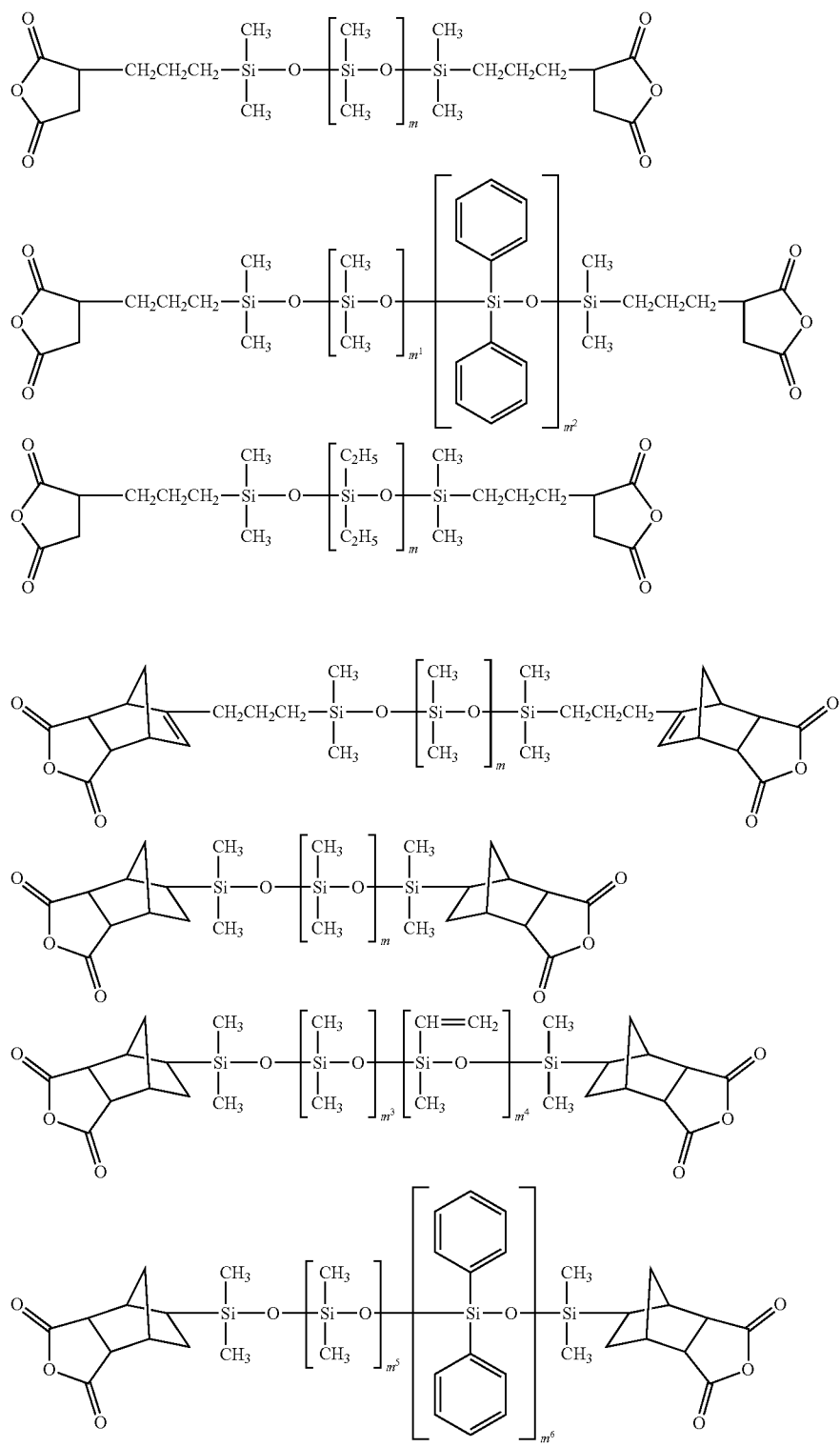

Herein m and $m^1$ to $m^6$ are as defined above.

The acid anhydride-modified silicone is obtained by reacting an acid anhydride having an unsaturated group such as succinic anhydride, norbornenedicarboxylic anhydride, propylnadic anhydride or phthalic anhydride with an organohydrogenpolysiloxane. The number of siloxane units in the acid anhydride-modified polysiloxane corresponds to the number of siloxane units in the organohydrogenpolysiloxane and accordingly, m in formula (2) represents an average value of the number of siloxane units.

Examples of the acid dianhydride include 3,3',4,4'-diphenylsulfonetetracarboxylic dianhydride, 3,3',4,4'-biphenyltetracarboxylic dianhydride, 2,3',3,4'-biphenyltetracarboxylic dianhydride, 5-(2,5-dioxotetrahydro-3-furanyl)-3-methyl-3- cyclohexene-1,2-dicarboxylic anhydride, 4-(2,5-dioxotetrahydrofuran-3-yl)-1,2,3,4-tetrahydronaphthalene-1,2-dicarboxylic anhydride, 1,2,3,4-butanetetracarboxylic dianhydride, 3,3',4,4'-benzophenonetetracarboxylic dianhydride, 4,4'-hexafluoropropylidenebisphthalic dianhydride, 2,2-bis(p-trimellitoxyphenyl)propane, 1,3-tetramethyldisiloxanebisphthalic dianhydride, and 4,4'-oxydiphthalic dianhydride.

Examples of the diamine free of phenolic hydroxyl group and carboxyl group include 4,4'-diaminobenzanilide, 4,4'-diaminodiphenyl ether, 3,4'-diaminodiphenyl ether, 4,4'-diaminodiphenyl sulfone, 3,3'-dimethyl-4,4'-diaminobiphenyl, 4,4'-(p-phenylenediisopropylidene)dianiline, 4,4'-(m-phenylenediisopropylidene)dianiline, 1,3-bis(4-aminophenoxy)benzene, 1,4-bis(4-aminophenoxy)benzene, 1,3-bis(3-aminophenoxy)benzene, 2,2-bis[4-(4-aminophenoxy)phenyl]propane, 2,2-bis[4-(4-aminophenoxy)phenyl]hexafluoropropane, bis[4-(4-aminophenoxy)phenyl]sulfone, bis[4-(3-aminophenoxy)phenyl]sulfone, 4,4'-bis(4-aminophenoxy)biphenyl, and 9,9-bis(4-aminophenyl)fluorene.

In the synthesis of polyamic acid, the proportion of the diamine to the acid dianhydride may be determined as appropriate depending on the desired molecular weight of the polyimide and is typically about 0.95 to 1.05, preferably 0.98 to 1.02 in molar ratio. In order to introduce a reactive functional group at the end of the polyimide silicone, an acid anhydride or amine compound having a functional group such as aminoalcohol, aminothiol or trimellitic anhydride may be added after the reaction, and further reacted with the reaction product. The amount of the acid anhydride or amine compound having a functional group added at this point is preferably up to 0.2 mole per mole of the acid dianhydride or diamine component.

The reaction of the diamine with the acid dianhydride is typically carried out in a solvent. The solvent used herein is not particularly limited as long as the polyimide is dissolved therein. Examples of the solvent include ethers such as tetrahydrofuran and anisole; ketones such as cyclohexanone, 2-butanone, methyl isobutyl ketone, 2-heptanone, 2-octanone and acetophenone; esters such as butyl acetate, methyl benzoate, and γ-butyrolactone; cellosolves such as butyl cellosolve acetate and propylene glycol monomethyl ether acetate; amides such as N,N-dimethylforamide, N,N-dimethylacetamide, and N-methyl-2-pyrrolidone; and aromatic hydrocarbons such as toluene and xylene. Of these, ketones, esters and cellosolves are preferred. Inter alia, γ-butyrolactone, propylene glycol monomethyl ether acetate, N,N-dimethylacetamide, and N-methyl-2-pyrrolidone are most preferred. The solvents may be used alone or in admixture. The amount of the solvent used is typically adjusted in consideration of the yield per batch and the viscosity of the solution, such that the concentration of polyamic acid may be 10 to 40% by weight.

The resulting polyamic acid is then converted to a polyimide having a phenolic hydroxyl group via dehydrating cyclization reaction. The dehydrating cyclization reaction may be performed by heating the polyamic acid solution at a temperature of 80 to 250° C., preferably 150 to 220° C., or by adding an acetic anhydride/pyridine mixture to the polyamic acid solution and heating the resulting solution at about 50° C. Then dehydrating cyclization reaction takes place on the acid amide portion of the polyamic acid to induce polyimidization.

Thereafter, the desired polyimide silicone may be obtained by reacting the reaction product with a primary alcohol having an epoxy group as shown below.

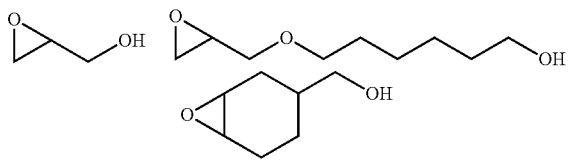

The amount of the epoxy-containing primary alcohol charged may be set as appropriate depending on the desired content of primary alcoholic hydroxyl group introduced. Typically, the epoxy-containing primary alcohol is preferably used in an amount of 0.3 to 3 moles per mole of phenolic hydroxyl group. The reaction temperature is typically about 40 to 180° C., preferably 60 to 160° C. The reaction time is preferably several minutes to about 15 hours. A catalyst such as triethylamine may be added for the purpose of promoting the reaction.

After the epoxy-containing primary alcohol is reacted, an acid anhydride may be reacted if necessary. Suitable acid anhydrides include phthalic anhydride, norbornenedicarboxylic anhydride, cyclohexyldicarboxylic anhydride, methylcyclohexyldicarboxylic anhydride, and succinic anhydride. By adding a necessary equivalent amount of the acid anhydride and heating the mixture, a polyimide silicone having a carboxyl group as well as a primary alcoholic hydroxyl group is obtained. The reaction temperature is typically about 10 to 120° C., preferably 20 to 90° C. The reaction time is preferably about 1 to 15 hours. A catalyst may be added to promote the reaction.

(B) Crosslinker

Component (B) is a crosslinker which provokes crosslinking reaction with component (A) to facilitate pattern formation and enhance film strength.

Examples of the crosslinker include nitrogen-containing compounds containing on the average at least two methylol and/or alkoxymethyl groups per molecule, such as melamine compounds, guanamine compounds, glycoluril compounds and urea compounds, and condensates thereof, and phenol compounds containing on the average at least two methylol or alkoxymethyl groups per molecule.

Suitable melamine compounds include those having the formula (6).

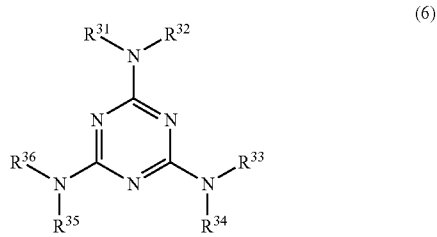

(6)

Herein, $R^{31}$ to $R^{36}$ are each independently a methylol group, $C_2$-$C_5$ alkoxymethyl group or hydrogen, at least two of $R^{31}$ to $R^{36}$ being methylol or alkoxymethyl. Typical of the alkoxymethyl group are methoxymethyl and ethoxymethyl.

Examples of the melamine compound include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

Examples of the guanamine compound include tetramethylolguanamine, tetramethoxymethylguanamine, and tetramethoxyethylguanamine. Examples of the glycoluril compound include tetramethylolglycoluril and tetrakis (methoxymethyl)glycoluril. Examples of the urea compound include tetramethylolurea, tetramethoxymethylurea, tetramethoxyethylurea, tetraethoxymethylurea, and tetrapropoxymethylurea.

Examples of the condensates of the nitrogen-containing compounds include condensates of the nitrogen-containing compounds with formaldehyde. Condensates of melamine compounds and condensates of urea compounds are preferred. The condensates of the nitrogen-containing compounds may be prepared by any prior art well-known methods.

Examples of the phenol compound containing on the average at least two methylol or alkoxymethyl groups per molecule include (2-hydroxy-5-methyl)-1,3-benzenedimethanol and 2,2',6,6'-tetramethoxymethylbisphenol A.

An appropriate amount of component (B) used is 0.5 to 50 parts by weight, more preferably 1 to 30 parts by weight per 100 parts by weight of component (A). As long as the amount of component (B) is in the range, the composition is fully photo-curable and useful as resist material. The foregoing compounds as component (B) may be used alone or in admixture.

(C) Photoacid Generator

Component (C) is a photoacid generator (PAG), which is not particularly limited as long as it is decomposed to generate an acid upon light exposure. The preferred PAG is a compound which is decomposed to generate an acid upon exposure to light of wavelength 240 to 500 nm. The PAG functions as a curing catalyst. Suitable examples of the PAG include onium salts, diazomethane derivatives, glyoxime derivatives, β-ketosulfone derivatives, disulfone derivatives, nitrobenzylsulfonate derivatives, sulfonic acid ester derivatives, imidoyl sulfonate derivatives, oxime sulfonate derivatives, imino sulfonate derivatives, and triazine derivatives.

Examples of the onium salt include sulfonium salts having the formula (7) and iodonium salts having the formula (8).

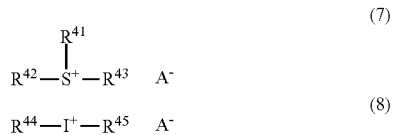

Herein, $R^{41}$ to $R^{45}$ are each independently an optionally substituted $C_1$-$C_{12}$ alkyl group, an optionally substituted $C_6$-$C_{12}$ aryl group, or an optionally substituted $C_7$-$C_{12}$ aralkyl group. $A^-$ is a non-nucleophilic counter ion.

The alkyl group may be straight, branched or cyclic, and examples include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl, and adamantly. Suitable aryl groups include phenyl, naphthyl and biphenylyl. Suitable aralkyl groups include benzyl and phenethyl. Suitable substituents include oxo, straight, branched or cyclic $C_1$-$C_{12}$ alkoxy, straight, branched or cyclic $C_1$-$C_{12}$ alkyl, $C_6$-$C_{24}$ aryl, $C_7$-$C_{25}$ aralkyl, $C_6$-$C_{24}$ aryloxy, and $C_6$-$C_{24}$ arylthio groups.

$R^{41}$ to $R^{45}$ are preferably selected from optionally substituted alkyl groups such as methyl, ethyl, propyl, butyl, cyclohexyl, norbornyl, adamantyl, and 2-oxocyclohexyl; optionally substituted aryl groups such as phenyl, naphthyl, biphenylyl, 2-, 3- or 4-methoxyphenyl, ethoxyphenyl, 3- or 4-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Inter alia, optionally substituted aryl groups and optionally substituted aralkyl groups are more preferred.

Examples of the non-nucleophilic counter ion include halide ions such as chloride and bromide; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; and hexafluorophosphate and fluorinated alkylfluorophosphate ions.

The diazomethane derivatives include compounds having the formula (9).

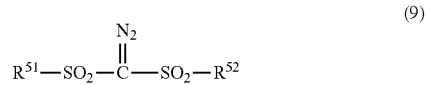

Herein, $R^{51}$ and $R^{52}$ are each independently a $C_1$-$C_{12}$ alkyl or haloalkyl group, optionally substituted $C_6$-$C_{12}$ aryl group, or optionally substituted $C_7$-$C_{12}$ aralkyl group.

Examples of the alkyl group are as exemplified above for $R^{41}$ to $R^{45}$. Examples of the haloalkyl group include trifluoromethyl, 1,1,1-trifluoroethyl, 1,1,1-trichloroethyl, and nonafluorobutyl.

Examples of the optionally substituted aryl group include phenyl, alkoxyphenyl groups such as 2-, 3- or 4-methoxyphenyl, 2-, 3- or 4-ethoxyphenyl, 3- or 4-tert-butoxyphenyl, alkylphenyl groups such as 2-, 3- or 4-methylphenyl, ethylphenyl, 4-tert-butylphenyl, 4-butylphenyl, dimethylphenyl, and haloaryl groups such as fluorophenyl, chlorophenyl, and 1,2,3,4,5-pentafluorophenyl. Examples of the optionally substituted aralkyl group include benzyl and phenethyl.

The glyoxime derivatives include compounds having the formula (10).

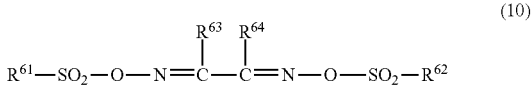

Herein, $R^{61}$ to $R^{64}$ are each independently a $C_1$-$C_{12}$ alkyl or haloalkyl group, optionally substituted $C_6$-$C_{12}$ aryl group, or optionally substituted $C_7$-$C_{12}$ aralkyl group. $R^{63}$ and $R^{64}$ may bond together to form a ring with the carbon atoms to which they are attached, and in the case of ring formation, a combination of $R^{63}$ and $R^{64}$ is a straight or branched $C_1$-$C_{12}$ alkanediyl group.

Examples of the alkyl, haloalkyl, optionally substituted aryl group, and optionally substituted aralkyl group are as exemplified above for $R^{51}$ and $R^{52}$. Examples of the straight or branched alkanediyl group include methylene, ethanediyl, propanediyl, butanediyl and hexanediyl.

Suitable onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl (2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl (4-thiophenoxyphenyl)sulfonium hexafluoroantimonate, [4-(4-biphenylylthio)phenyl]-4-biphenylylphenylsulfonium tris(trifluoromethanesulfonyl)methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis (pentafluorophenyl)borate.

Suitable diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl) diazomethane, bis(sec-pentylsulfonyl)diazomethane, bis (tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Suitable glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

Suitable β-ketosulfone derivatives include 2-cyclohexylcarbonyl-2-(p-toluenesulfonyl)propane and 2-isopropylcarbonyl-2-(p-toluenesulfonyl)propane.

Suitable disulfone derivatives include diphenyl disulfone and dicyclohexyl disulfone.

Suitable nitrobenzyl sulfonate derivatives include 2,6-dinitrobenzyl p-toluenesulfonate and 2,4-dinitrobenzyl p-toluenesulfonate.

Suitable sulfonic acid ester derivatives include 1,2,3-tris (methanesulfonyloxy)benzene, 1,2,3-tris(trifluoromethanesulfonyloxy)benzene, and 1,2,3-tris(p-toluenesulfonyloxy) benzene.

Suitable imidoyl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and N-trifluoromethylsulfonyloxynaphthylimide.

Typical of oximesulfonate derivatives is α-(benzenesulfoniumoxyimino)-4-methylphenylacetonitrile.

Suitable iminosulfonate derivatives include (5-(4-methylphenyl)sulfonyloxyimino-5H-thiophen-2-ylidene)-(2-methylphenyl)acetonitrile and [5-(4-(4-methylphenylsulfonyloxy)phenylsulfonyloxyimino)-5H-thiophen-2-ylidene]-(2-methylphenyl)acetonitrile.

Suitable triazine derivatives include 2-(methoxyphenyl)-4,6-bis(trichloromethyl)-s-triazine, 2-[2-(3,4-dimethoxyphenyl)ethenyl]-4,6-bis(trichloromethyl)-s-triazine, 2-[2-(furan-2-yl)ethenyl]-4,6-bis(trichloromethyl)-s-triazine, and 2-[2-(5-methylfuran-2-yl)ethenyl]-4,6-bis(trichloromethyl)-s-triazine.

Of the PAGs (C), the onium salts are preferred, with the sulfonium salts being more preferred.

An appropriate amount of component (C) used is 0.05 to 20 parts by weight, more preferably 0.2 to 5 parts by weight per 100 parts by weight of component (A). As long as the amount of component (C) is in the range, the composition is fully photo-curable and effectively curable in thick film form. The foregoing compounds as component (C) may be used alone or in admixture.

(D) Polyfunctional Epoxy Compound

Component (D) is a polyfunctional epoxy compound which undergoes crosslinking reaction with the base polymer (i.e., component (A)) upon heat curing of a resin film after patterning, contributing to the reliability of the film and the adhesion of the film to the substrate (simply referred to as "substrate adhesion," hereinafter).

Examples of the polyfunctional epoxy compound include glycidyl ether forms of phenols, alicyclic epoxy compounds having a cyclohexene oxide group, and those compounds obtained by introducing an epoxy compound having an unsaturated bond into an organosiloxane having a hydrosilyl group through hydrosilylation reaction.

In the glycidyl ether forms of phenols, the phenol structure may be of novolak, bisphenol, biphenyl, phenolaralkyl, dicyclopentadiene, naphthalene, or amino-containing type. Suitable glycidyl ether forms of phenols include glycidyl ethers of bisphenol A, AD, S and F type, glycidyl ethers of hydrogenated bisphenol A, glycidyl ethers of ethylene oxide adduct bisphenol A, glycidyl ethers of propylene oxide adduct bisphenol A, glycidyl ethers of phenol novolak resins, glycidyl ethers of cresol novolak resins, glycidyl ethers of naphthalene resins, glycidyl ethers of dicyclopentadiene phenol resins, and trifunctional epoxy forms of aminophenol.

The alicyclic epoxy compounds having a cyclohexene oxide group include tetra(3,4-epoxycyclohexylmethyl)-modified ε-caprolactone butanetetracarboxylate as well as the compound shown below.

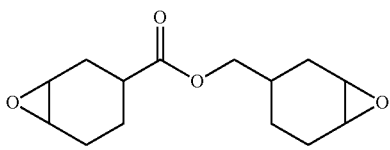 [SMILES: O=C(OCC1CCC2OC2C1)C1CCC2OC2C1]

The compounds obtained by introducing an epoxy compound having an unsaturated bond into an organosiloxane having a hydrosilyl group through hydrosilylation reaction include the reaction product obtained by reacting an epoxy compound having an unsaturated bond such as allyl glycidyl ether or vinyl cyclohexyl epoxide with an organosiloxane having a hydrosilyl group.

Illustrative examples of such compounds include epoxy-containing organopolysiloxanes having the formula (11), epoxy-containing cyclosiloxanes having the formula (12), and bissilyl-substituted compounds having the formula (13).

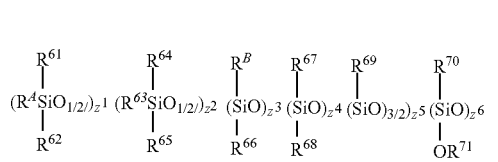

(11)

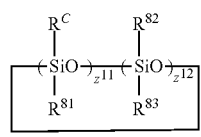

(12)

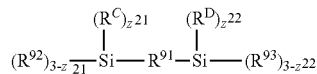

(13)

In formulae (11) to (13), $R^A$ to $R^D$ are each independently an epoxy-containing organic group. Preferred examples of the epoxy-containing organic group include, but are not limited to, epoxy-containing alkyl groups such as glycidoxypropyl and cyclohexylepoxyethyl. Of these, glycidoxypropyl is most preferred as $R^A$ to $R^D$.

In formulae (11) to (13), $R^{61}$ to $R^{70}$, $R^{81}$ to $R^{83}$, $R^{92}$ and $R^{93}$ are each independently a $C_1$-$C_8$ monovalent hydrocarbon group. Suitable monovalent hydrocarbon groups are as exemplified above for $R^1$ to $R^6$ in formula (2).

In formula (11), $R^{71}$ is hydrogen or a $C_1$-$C_8$ alkyl group. Suitable alkyl groups include methyl, ethyl, propyl, butyl, pentyl, hexyl, and octyl.

In formula (11), $z^1$ to $z^6$ are integers in the range: $0 \leq z^1 \leq 10$, $0 \leq z^2 \leq 10$, $0 \leq z^3 \leq 30$, $0 \leq z^4 \leq 100$, $0 \leq z^5 \leq 10$, $0 \leq z^6 \leq 20$, $z^1 + z^3 \geq 2$, $0.1 \leq (z^1 + z^3)/(z^1 + z^2 + z^3 + z^4) \leq 1$, and $0 \leq (z^5 + z^6)/(z^1 + z^2 + z^3 + z^4 + z^5 + z^6) \leq 0.05$.

In formula (12), $z^{11}$ and $z^{12}$ are integers in the range: $2 \leq z^{11} \leq 10$, $0 \leq z^{12} \leq 20$, and $0.2 \leq z^{11}/(z^{11} + z^{12}) \leq 1$.

In formula (13), $R^{91}$ is a $C_2$-$C_{24}$ divalent organic group. The divalent organic group may be straight, branched or cyclic. Examples include alkanediyl groups such as ethanediyl, propanediyl and hexanediyl, cycloalkanediyl groups such as cyclopentanediyl and cyclohexanediyl, divalent aromatic groups such as phenylene and biphenyldiyl, and groups obtained by combining plural such groups.

In formula (13), $z^{21}$ and $z^{22}$ are each independently an integer of 1 to 3. Examples of the epoxy-containing organopolysiloxane having formula (11) are shown below, but not limited thereto.

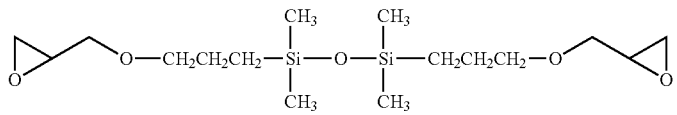

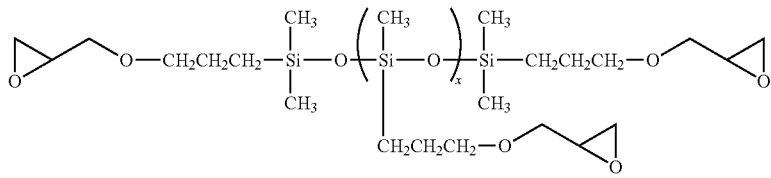

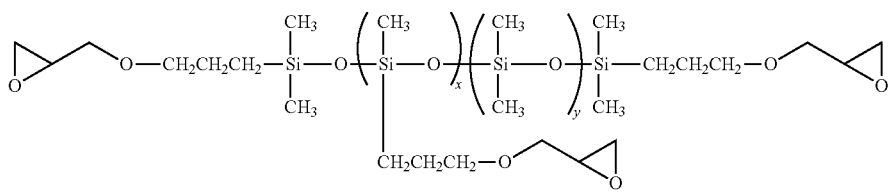

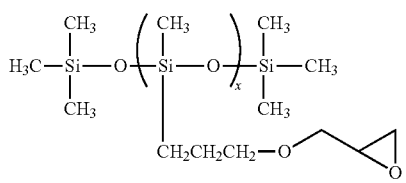

Herein x is preferably an integer of 1 to 10, and y is preferably an integer of 1 to 5.

Examples of the epoxy-containing cyclosiloxane having formula (12) are shown below, but not limited thereto.

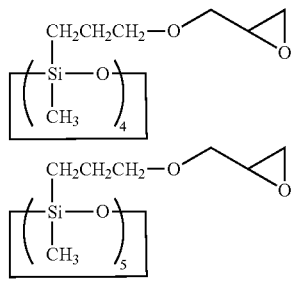

Examples of the bissilyl-substituted compound having formula (13) are shown below, but not limited thereto.

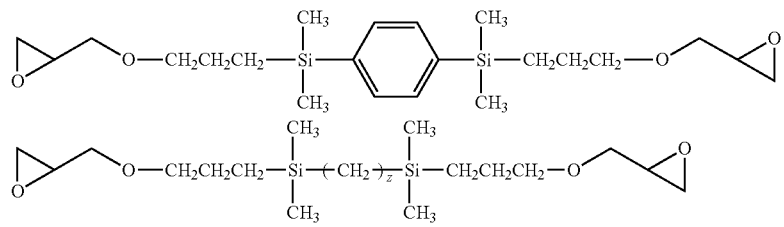

An appropriate amount of component (D) used is 0.05 to 100 parts, more preferably 0.1 to 50 parts, even more preferably 1 to 30 parts by weight per 100 parts by weight of component (A). As long as the amount of component (D) is in the range, the composition cures into a film having improved toughness and substrate adhesion. The foregoing compounds as component (D) may be used alone or in admixture.

(E) Filler

Component (E) is a filler, which is typically selected from silica, alumina, silicon nitride, and titanium oxide, but not limited thereto. The filler may or may not have been surface-modified prior to use. The modified filler is preferred because better transparency is expectable. For example, silane coupling agents, titanate coupling agents, and organic silyl chlorides may be used for the surface modification of the filler.

The filler should have an average particle size of 0.01 to 20.0 μm, preferably 0.05 to 3.0 μm. An average particle size of less than 0.01 μm invites a cost increase whereas a size in excess of 20.0 μm causes a loss of transparency. The average particle size is measured by a particle size distribution measuring instrument based on the laser diffraction method, as a volume average value, that is, volume basis 50% cumulative particle diameter ($D_{50}$) or median diameter.

The amount of component (E) used is 1 to 70 parts, preferably 10 to 40 parts by weight per 100 parts by weight of component (A). If the amount is less than the range, the filling effect is little exerted. An excessive amount of the filler causes to reduce the transparency of a film to prevent the film from receiving a sufficient dose of light in the exposure step. The foregoing compounds as component (E) may be used alone or in admixture.

(F) Colorant

Component (F) is a colorant, which is typically selected from pigments and dyes. Inter alia, carbon black is preferred from the standpoint of laser marking. The amount of component (F) used is 0.01 to 30 parts, preferably 0.1 to 10 parts, more preferably 0.8 to 5 parts by weight per 100 parts by weight of component (A). Less than 0.01 part by weight of component (F) achieves little coloring effect. More than 30 parts by weight of component (F) causes a substantial drop of light transmittance, giving rise to the problems of undercure upon exposure and side reactions to interfere with crosslinking reaction. The foregoing compounds as component (F) may be used alone or in admixture.

(G) Organic Solvent

The photosensitive resin composition may further contain (G) an organic solvent, if necessary. Preference is given to the solvent in which components (A), (B), (C) and (D) are dissolvable and components (E) and (F) are dispersible.

Examples of the organic solvent include ketones such as cyclohexanone, cyclopentanone, and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; and amides such as N-methyl-2-pyrrolidone and N,N-dimethylacetamide.

Of the above organic solvents, preferred are propylene glycol monomethyl ether acetate, propylene glycol monomethyl ether, ethyl lactate, cyclohexanone, cyclopentanone, methyl isobutyl ketone, γ-butyrolactone, and mixtures thereof, in which the PAG is most soluble.

The organic solvent as component (G) is preferably used in an amount of 20 to 90% by weight, more preferably 30 to 65% by weight of the resin composition. As long as the amount of component (G) is within the range, components (A) to (D) remain fully compatible and the composition is effectively coated. The foregoing solvents as component (G) may be used alone or in admixture.

Other Components

Besides the foregoing components, the photosensitive resin composition may further contain any other components. Surfactants and adhesion promoters are exemplary.

The surfactant is effective for improving coating properties. Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-4430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad® FC-4430 and X-70-093. The amount of the surfactant is preferably 0.03 to 5 parts by weight, more preferably 0.1 to 3 parts by weight per 100 parts by weight of component (A). The foregoing surfactants may be used alone or in admixture.

The adhesion promoter is effective for improving adhesion properties. Suitable adhesion promoters include silane coupling agents and hydrolytic condensates (or oligomers) thereof, and commercially available adhesion promoters. Suitable epoxy-base silane coupling agents are available under the trade name of KBM-403, KBM-402, KBE-403, and KBE-402, and suitable amine-base silane coupling agents are available under the trade name of KBM-903, KBM-603 and KBM-573, all from Shin-Etsu Chemical Co., Ltd. The amount of the adhesion promoter is preferably 0.1 to 10 parts by weight, more preferably 0.2 to 5 parts by weight per 100 parts by weight of component (A). The foregoing adhesion promoters may be used alone or in admixture.

Additionally, a photo-absorber may be added to improve the photo-absorption efficiency of the PAG and the like. Suitable photo-absorbers include diaryl sulfoxides, diaryl sulfones, 9,10-dimethylanthracene, and 9-fluorenone. A basic compound may be added for sensitivity adjustment. Suitable basic compounds include tertiary amine compounds such as triethanolamine, and nitrogen-containing compounds such as benzotriazole and pyridine. The amounts of these additives are not particularly limited as long as the benefits of the invention are not impaired.

In one embodiment, the photosensitive resin composition is used as a resist material. In this embodiment, any other optional components which are commonly used in resist materials may be added. The amounts of the optional components are not particularly limited as long as the benefits of the invention are not impaired.

The photosensitive resin composition of the invention is prepared by any conventional methods. For example, it may be prepared by agitating and mixing the aforementioned components and optionally organic solvent and additives, and optionally passing the mixture through a filter.

Photosensitive Resin Laminate

The photosensitive resin composition of the invention may be processed into a film prior to use. Where the photosensitive resin composition is processed into a film, another embodiment of the invention is a photosensitive resin laminate comprising a support film layer, a photosensitive resin layer formed of the photosensitive resin composition on the support film layer, and a cover film layer disposed on the photosensitive resin layer.

The support film is to bear the photosensitive resin layer and preferably selected from polyester, polyimide, polyamide, polyamide-imide, polyether imide, triacetate cellulose, polyether sulfone, and polyphenylene sulfide resins. The support film may be a film of plural plies.

Suitable polyesters include polyethylene terephthalate (PET), polybutylene terephthalate (PBT), and polyethylene naphthalate (PEN).

The thickness of the support film, which is not particularly limited, is preferably 10 to 500 µm, more preferably 35 to 200 µm. A support film thickness in the range ensures that a support film clears the minimum necessary rigidity, has a sufficient flexibility to manipulate the photosensitive resin laminate, and offers efficient working.

With respect to the thickness of the photosensitive resin laminate, the total thickness of resin film layer and support film layer is preferably 15 to 700 µm, more preferably 25 to 300 µm, even more preferably 30 to 200 µm. A total thickness of at least 15 µm ensures ease of handling of the laminate. A total thickness of up to 700 µm ensures good heat conduction so that the laminate is readily attached to a substrate.

The photosensitive resin layer may be formed by coating the photosensitive resin composition onto the support film and heating the coating to remove the solvent.

When the photosensitive resin laminate is applied or attached to a substrate, any suitable device such as vacuum laminator, pressure type vacuum laminator, tape attaching device or vacuum tape attaching device may be used. The recipient substrate is preferably heated so that the photosensitive resin layer of the photosensitive resin laminate is softened and tightly bonded to the substrate.

Also, the photosensitive resin composition finds use as protective film for semiconductor devices, protective film for wirings, cover lay film, solder resist, and microprocessing photoresist material.

Pattern Forming Process

A further embodiment of the invention is a process for forming a pattern on a substrate using the photosensitive resin composition. The process involves the steps of (i) forming a photosensitive resin film on a substrate using the photosensitive resin composition or photosensitive resin laminate, (ii) exposing the resin film to radiation, and (iii) developing the resin film in a developer.

Step (i) is to form a photosensitive resin film on a substrate using the photosensitive resin composition or photosensitive resin laminate. Examples of the substrate include silicon, glass, quartz wafers, silicon nitride substrates, silicon oxide substrates, plastic substrates such as paper phenol, glass epoxy and polyimide, ceramic circuit boards, and substrates having a resin coating on their surface.

The photosensitive resin film may be formed on the substrate by any well-known methods. For example, the photosensitive resin composition is applied onto the substrate by dipping, spin coating, or roll coating. The thickness of the photosensitive resin film may be selected as appropriate depending on the intended application and falls, for example, in the range of 0.1 to 300 µm. Alternatively, the photosensitive resin film may be formed on the substrate by using the photosensitive resin laminate, peeling the cover film layer, and attaching the photosensitive resin layer of the laminate to the substrate, thereby transferring the photosensitive resin layer onto the substrate.

For effective photo-curing reaction, the photosensitive resin composition may be preheated to evaporate off the solvent or the like. The preheating may be performed, for example, at 40 to 140° C. for about 1 minute to 1 hour.

In step (ii), the photosensitive resin film is exposed to radiation, preferably of wavelength 240 to 500 nm. Upon exposure, the photosensitive resin film is cured. Light exposure may be performed through a photomask. The photomask may be a mask perforated with the desired pattern. The photomask is preferably capable of shielding the radiation of wavelength 240 to 500 nm. In this sense, the photomask is preferably one having a light-shielding film of chromium, for example, but not limited thereto.

The radiation of wavelength 240 to 500 nm may be radiation emitted by a radiation generator, for example, UV radiation such as g-line or i-line, or deep-UV (248 nm). The exposure dose is preferably 10 to 5,000 mJ/cm$^2$, for example. The exposure step may be followed by post-exposure bake (PEB), if desired, for further enhancing development sensitivity. The PEB may be performed, for example, at 40 to 140° C. for about 0.5 to 10 minutes.

The exposure or PEB step is followed by step (iii) of developing the exposed resin film in a developer. The developer used herein is preferably selected from organic solvent developers such as dimethylacetamide and cyclohexanone, and basic aqueous solutions such as aqueous solutions of tetramethylammonium hydroxide (TMAH) and sodium carbonate. Development may be carried out typically by dipping the patternwise exposed film in the developer. The development is followed by washing, rinsing and drying, if desired. The desired pattern of photosensitive resin film is obtained.

The patterned film may be further heated in an oven or on a hot plate at 70 to 300° C., preferably 120 to 300° C. for about 10 minutes to 10 hours to increase the crosslinking density and remove any residual volatile components. This results in a cured resin film having tight substrate adhesion and satisfactory heat resistance, strength, and electric properties.

When it is desired to form a uniform or flat film, the above-mentioned process for forming a pattern may be followed without using the photomask.

The cured film obtained from the photosensitive resin composition has satisfactory substrate adhesion, heat resistance, and electric insulating properties, is advantageously used as protective film for electric and electronic parts, and semiconductor parts. A pattern of finer size may be formed. The cured film having satisfactory substrate adhesion, electric and mechanical properties is also useful as a protective film for semiconductor parts, protective film for wirings, cover lay film, solder resist, and the like.

EXAMPLE

Examples of the invention are given below by way of illustration and not by way of limitation. In Examples, weight average molecular weight (Mw) is measured by GPC versus polystyrene standards using tetrahydrofuran (THF) solvent.

The acid anhydride-modified silicones (S-1), (S-2) and (S-3) used in Examples are identified below.

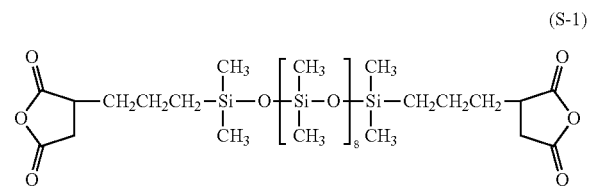
(S-1)

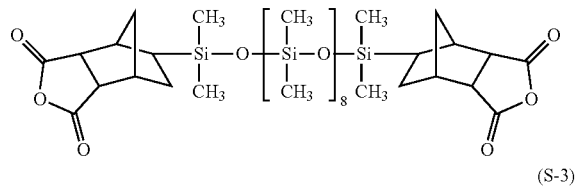
(S-2)

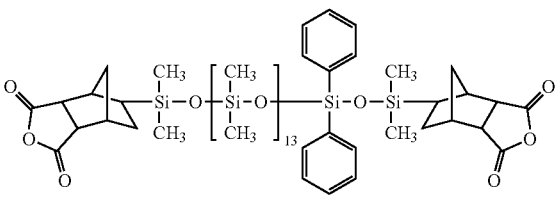
(S-3)

[1] Synthesis of Polyimide Silicone

Synthesis Example 1

A flask equipped with a stirrer, thermometer and nitrogen purge line was charged with 62.0 g (0.2 mol) of 4,4'-oxydiphthalic dianhydride, 302.3 g (0.3 mol) of acid anhydride-modified silicone (S-1), and 800 g of N-methyl-2-pyrrolidone. To the flask, 183.1 g (0.5 mol) of 2,2-bis(4-amino-3-hydroxyphenyl)hexafluoropropane was added in a controlled manner such that the temperature of the reaction solution might not exceed 50° C. Stirring was continued at room temperature for 10 hours. After a reflux condenser with a water trap was attached to the flask, 120 g of xylene was added to the flask, which was heated at 170° C. and held at the temperature for 6 hours, whereupon the solution turned brown. The brown solution was cooled to room temperature (25° C.), which was a solution of a polyimide silicone having a phenolic hydroxyl group.

Glycidol, 25.0 g, was added to the polyimide silicone solution, which was heated at 120° C. for 3 hours. At the end of reaction, the reaction solution was cooled to room temperature and poured into methanol for precipitation. The precipitate was filtered and dried, obtaining the desired polyimide silicone (A-1) having a primary alcoholic hydroxyl group. On analysis of polyimide silicone (A-1) by $^1$H-NMR spectroscopy, the peak at 10 ppm assigned to phenolic hydroxyl group was reduced while the peaks at 4.6 ppm and 4.8 ppm assigned to primary and secondary alcoholic hydroxyl groups were observed. These data indicate that polyimide silicone (A-1) is a polymer of the formula shown below. On GPC analysis, polyimide silicone (A-1) had a Mw of 19,000. The content of primary alcoholic hydroxyl group was 0.00046 eq/g.

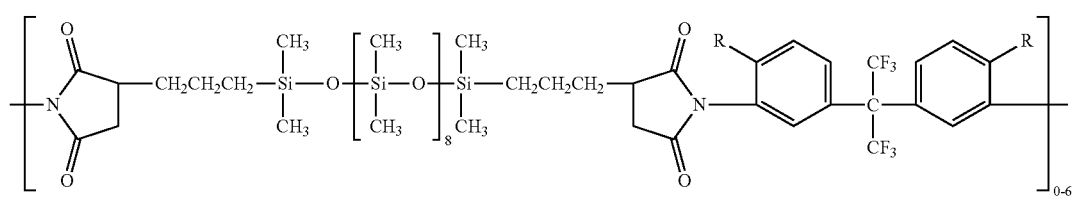

-continued

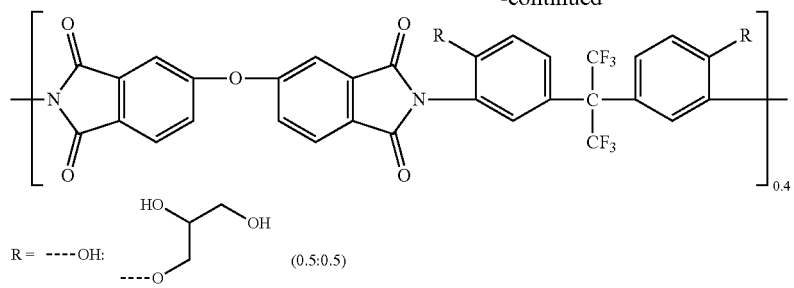

Synthesis Example 2

A flask equipped with a stirrer, thermometer and nitrogen purge line was charged with 111.1 g (0.25 mol) of 4,4'-hexafluoropropylidenebisphthalic dianhydride, 264.0 g (0.25 mol) of acid anhydride-modified silicone (S-2), and

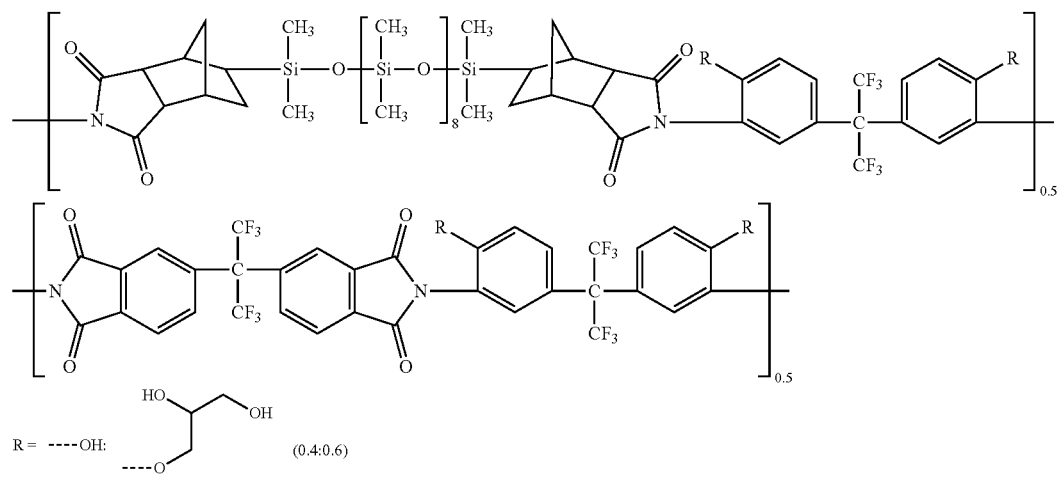

800 g of γ-butyrolactone. To the flask, 183.1 g (0.5 mol) of 2,2-bis(4-amino-3-hydroxyphenyl)hexafluoropropane was added in a controlled manner such that the temperature of the reaction solution might not exceed 50° C. Stirring was continued at room temperature for 10 hours. After a reflux condenser with a water trap was attached to the flask, 120 g of xylene was added to the flask, which was heated at 170° C. and held at the temperature for 6 hours, whereupon the solution turned brown. The brown solution was cooled to room temperature (25° C.), which was a solution of a polyimide silicone having a phenolic hydroxyl group.

Glycidol, 26.2 g, was added to the polyimide silicone solution, which was heated at 120° C. for 3 hours. At the end of reaction, the reaction solution was cooled to room temperature and poured into methanol for precipitation. The precipitate was filtered and dried, obtaining the desired polyimide silicone (A-2) having a primary alcoholic hydroxyl group. On analysis of polyimide silicone (A-2) by $^1$H-NMR spectroscopy, the peak at 10 ppm assigned to phenolic hydroxyl group was reduced while the peaks at 4.6 ppm and 4.8 ppm assigned to primary and secondary alcoholic hydroxyl groups were observed. These data indicate that polyimide silicone (A-2) is a polymer of the formula shown below. On GPC analysis, polyimide silicone (A-2) had a Mw of 18,100. The content of primary alcoholic hydroxyl group was 0.00056 eq/g.

Synthesis Example 3

A flask equipped with a stirrer, thermometer and nitrogen purge line was charged with 62.0 g (0.2 mol) of 4,4'-oxydiphthalic dianhydride, 325.0 g (0.2 mol) of acid anhydride-modified silicone (S-3), and 800 g of γ-butyrolactone. To the flask, 73.3 g (0.2 mol) of 2,2-bis(4-amino-3-hydroxyphenyl)hexafluoropropane and 58.5 g (0.2 mol) of 1,3-bis(3-aminophenoxy)benzene were added in a controlled manner such that the temperature of the reaction solution might not exceed 50° C. Then 1.1 g (0.01 mol) of p-aminophenol was added. Stirring was continued at room temperature for 10 hours. After a reflux condenser with a water trap was attached to the flask, 250 g of xylene was added to the flask, which was heated at 170° C. and held at the temperature for 6 hours, whereupon the solution turned brown. The brown solution was cooled to room temperature (25° C.), which was a solution of a polyimide silicone having a phenolic hydroxyl group.

Glycidol, 22.4 g, was added to the polyimide silicone solution, which was heated at 120° C. for 3 hours. At the end of reaction, the reaction solution was cooled to room temperature and poured into methanol for precipitation. The precipitate was filtered and dried, obtaining the desired polyimide silicone (A-3) having a primary alcoholic hydroxyl group. On analysis of polyimide silicone (A-3) by ¹H-NMR spectroscopy, the peak at 10 ppm assigned to phenolic hydroxyl group was reduced while the peaks at 4.6 ppm and 4.8 ppm assigned to primary and secondary alcoholic hydroxyl groups were observed. These data indicate that polyimide silicone (A-3) is a polymer of the formula shown below. On GPC analysis, polyimide silicone (A-3) had a Mw of 19,700. The content of primary alcoholic hydroxyl group was 0.00029 eq/g.

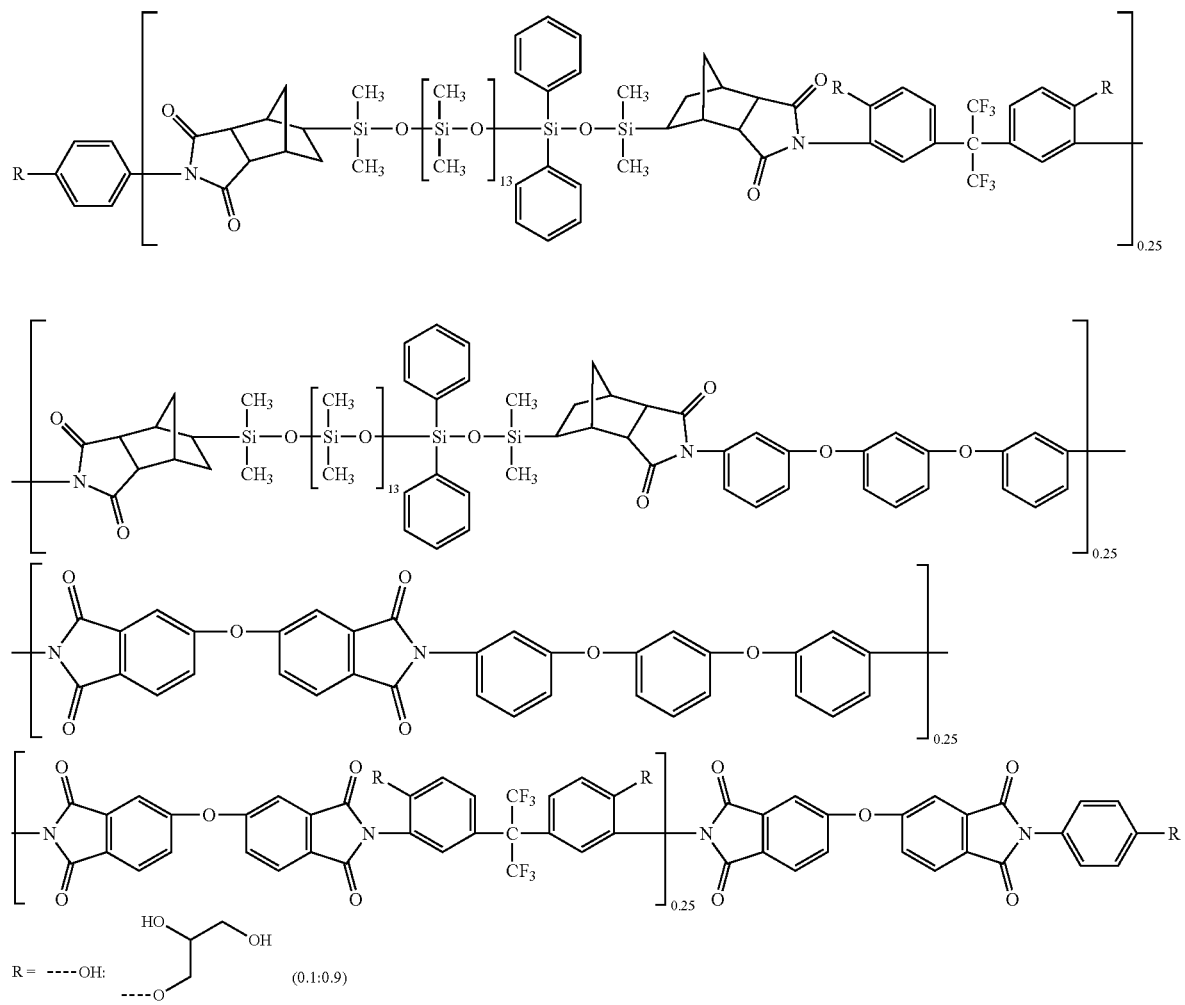

Synthesis Example 4

A flask equipped with a stirrer, thermometer and nitrogen purge line was charged with 91.6 g (0.25 mol) of 4,4'-oxydiphthalic dianhydride, 406.2 g (0.25 mol) of acid anhydride-modified silicone (S-3), and 1,000 g of γ-butyrolactone. To the flask, 146.5 g (0.40 mol) of 2,2-bis(4-amino-3-hydroxyphenyl)hexafluoropropane and 29.2 g (0.10 mol) of 1,3-bis(3-aminophenoxy)benzene were added in a controlled manner such that the temperature of the reaction solution might not exceed 50° C. Then 2.7 g (0.025 mol) of p-aminophenol was added. Stirring was continued at room temperature for 10 hours. After a reflux condenser with a water trap was attached to the flask, 300 g of xylene was added to the flask, which was heated at 170° C. and held at the temperature for 6 hours, whereupon the solution turned brown. The brown solution was cooled to room temperature (25° C.), which was a solution of a polyimide silicone having a phenolic hydroxyl group.

Glycidol, 30.1 g, was added to the polyimide silicone solution, which was heated at 120° C. for 3 hours. At the end of reaction, the reaction solution was cooled to room temperature and poured into methanol for precipitation. The precipitate was filtered and dried, obtaining the desired polyimide silicone (A-4) having a primary alcoholic hydroxyl group. On analysis of polyimide silicone (A-4) by ¹H-NMR spectroscopy, the peak at 10 ppm assigned to phenolic hydroxyl group was reduced while the peaks at 4.6 ppm and 4.8 ppm assigned to primary and secondary alcoholic hydroxyl groups were observed. These data indicate that polyimide silicone (A-4) is a polymer of the formula shown below. On GPC analysis, polyimide silicone (A-4) had a Mw of 18,400. The content of primary alcoholic hydroxyl group was 0.00039 eq/g.

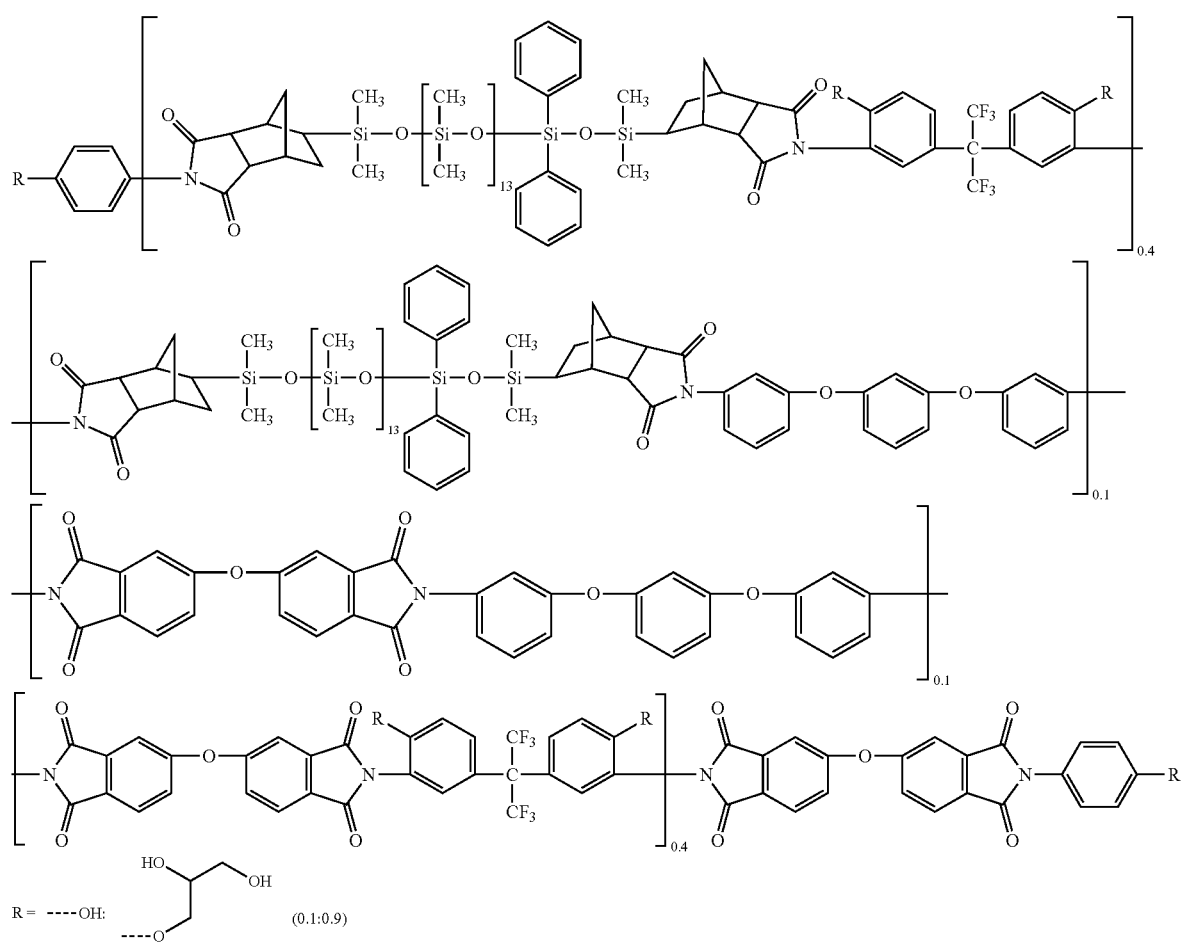

Comparative Synthesis Example 1

A flask equipped with a stirrer, thermometer and nitrogen purge line was charged with 62.0 g (0.2 mol) of 4,4'-oxydiphthalic dianhydride, 302.3 g (0.3 mol) of acid anhydride-modified silicone (S-1), and 800 g of N-methyl-2-pyrrolidone. To the flask, 183.1 g (0.5 mol) of 2,2-bis(4-amino-3-hydroxyphenyl)hexafluoropropane was added in a controlled manner such that the temperature of the reaction solution might not exceed 50° C. Stirring was continued at room temperature for 10 hours. After a reflux condenser with a water trap was attached to the flask, 120 g of xylene was added to the flask, which was heated at 170° C. and held at the temperature for 6 hours, whereupon the solution turned brown. The brown solution was cooled to room temperature (25° C.) and poured into methanol for precipitation. The precipitate was filtered and dried, obtaining a polyimide silicone (A'-1) having a phenolic hydroxyl group. On GPC analysis, polyimide silicone (A'-1) had a Mw of 17,800.

[2] Preparation of Photosensitive Resin Compositions and Evaluation

Examples 1 to 16 and Comparative Examples 1 to 8

Photosensitive resin compositions were prepared by combining components (A) to (G) in accordance with the formulation shown in Tables 1 and 2, agitating and mixing them. The components are identified below.

(A) Polyimide Silicone:

Polyimide silicones A-1 to A-4 and A'-1

(B) Crosslinker: B-1 and B-2

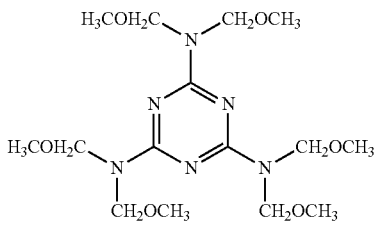

B-1

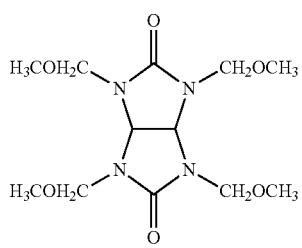

B-2

(C) PAG: C-1 and C-2

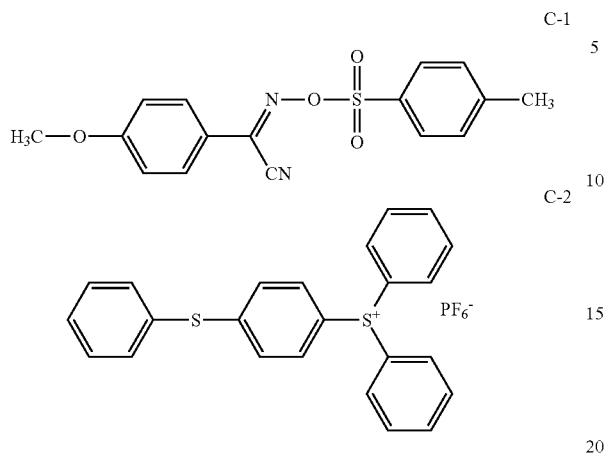

C-1

C-2

(D) Polyfunctional Epoxy Compound:
D-1: Epikote 828, difunctional epoxy resin, by Mitsubishi Chemical Corp.
D-2: Celloxide® 2021P, difunctional epoxy resin, by Daicel Corp.
(E) Filler:
E-1: Silica, average particle size 0.5 μm, by Admatechs
E-2: Silica, average particle size 8.0 μm, by Admatechs
E-3: Silica, average particle size 20.0 μm, by Admatechs
(F) Colorant:
F-1: Carbon black, pigment, by Mitsubishi Chemical Corp.
F-2: Valifast® 1821, dye, by Orient Chemical Industries Co., Ltd.
(G) Solvent:
G-1: cyclopentanone
G-2: propylene glycol monomethyl ether

TABLE 1

| Composition (pbw) | | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| (A) | A-1 | 100 | 100 | 100 | 100 | 100 | 100 | 100 |  |  |  | 100 | 100 | 100 | 100 | 100 | 100 |
|  | A-2 |  |  |  |  |  |  |  | 100 |  |  |  |  |  |  |  |  |
|  | A-3 |  |  |  |  |  |  |  |  | 100 |  |  |  |  |  |  |  |
|  | A-4 |  |  |  |  |  |  |  |  |  | 100 |  |  |  |  |  |  |
| (B) | B-1 | 15 | 15 | 15 |  | 15 | 15 | 15 | 15 | 15 | 15 | 15 | 15 | 15 | 25 | 15 | 15 |
|  | B-2 |  |  |  | 15 |  |  |  |  |  |  |  |  |  |  |  |  |
| (C) | C-1 | 3 | 3 | 3 | 3 |  | 3 | 3 | 3 | 3 | 3 | 3 | 3 | 3 | 5 | 3 | 3 |
|  | C-2 |  |  |  |  |  | 3 |  |  |  |  |  |  |  |  |  |  |
| (D) | D-1 | 15 | 15 | 15 | 15 | 15 |  |  | 15 | 15 | 15 | 15 | 15 | 15 | 15 | 15 | 15 |
|  | D-2 |  |  |  |  |  | 15 | 5 |  |  |  |  |  |  |  |  |  |
| (E) | E-1 | 30 | 50 |  | 30 | 30 | 30 | 30 | 30 | 30 | 30 | 30 | 30 | 30 |  | 15 |  |
|  | E-2 |  |  | 30 |  |  |  |  |  |  |  |  |  |  |  |  | 20 |
|  | E-3 |  |  |  |  |  |  |  |  |  |  |  |  |  | 30 |  |  |
| (F) | F-1 | 2 | 2 | 2 | 2 | 2 | 2 | 2 | 2 | 2 | 2 | 4 |  |  | 2 |  | 4 |
|  | F-2 |  |  |  |  |  |  |  |  |  |  |  | 2 | 4 |  | 2 |  |
| (G) | G-1 | 100 | 100 | 100 | 100 | 100 | 100 | 100 | 100 | 100 | 100 | 100 | 100 | 100 | 100 |  | 100 |
|  | G-2 |  |  |  |  |  |  |  |  |  |  |  |  |  |  | 100 |  |

TABLE 2

| Composition (pbw) | | Comparative Example | | | | | | | |
|---|---|---|---|---|---|---|---|---|---|
| | | 1 | 2 | 3 | 4 | 5 | 6 | 7 | 8 |
| (A) | A-1 | 100 | 100 | 100 | 100 | 100 | 100 | | |
| | A'-1 | | | | | | | 100 | 100 |
| (B) | B-1 | 15 | 15 | 15 | 15 | 15 | 15 | 15 | |
| | B-2 | | | | | | | | 15 |
| (C) | C-1 | 3 | 3 | 3 | 3 | 3 | 3 | 3 | 3 |
| (D) | D-1 | 15 | 15 | 15 | 15 | 15 | 15 | 15 | 15 |
| (E) | E-1 | 30 | 75 | | 30 | 30 | 0 | 30 | 30 |
| | E-2 | | | 75 | | | | | |
| (F) | F-1 | 0 | 2 | 2 | 35 | | 2 | 2 | 2 |
| | F-2 | | | | | 35 | | | |
| (G) | G-1 | 100 | 100 | 100 | 100 | 100 | 100 | 100 | 100 |

[Preparation of Photosensitive Resin Laminate]

Using a blade knife, each of photosensitive resin compositions in Tables 1 and 2 was coated onto a PET support film of 100 μm thick. The coating was heated in a dryer at 100° C. for 10 minutes, to form a photosensitive resin layer of 50 μm thick on the PET film. A cover film of polyethylene was laid on the photosensitive resin layer, completing a photosensitive resin laminate. Evaluation was made by the following tests. The thickness of a resin layer was measured by a contact type thickness meter.

Patterning Test

The cover film was peeled from the laminate to expose the photosensitive resin layer. The photosensitive resin layer was bonded to a 8-inch silicon wafer by means of a film laminator, after which the PET support film was peeled. The photosensitive resin layer was transferred onto the silicon wafer. The resin layer was dried by heating on a hot plate at 90° C. for 2 minutes. Using a Mask Aligner MA8 (SUSS MicroTec AG, light source wavelength: broad band), the photosensitive resin layer was exposed to a broad band of UV radiation in a dose of 2,000 mJ/cm$^2$ through a quartz mask having equi-spaced holes of diameter 200 μm. After the exposure, the resin layer was heated on a hot plate at 90° C. for 2 minutes, cooled, and dipped in a 2.38 wt % TMAH aqueous solution for 5 minutes to dissolve away the unexposed region, forming a pattern. The sample was rated "OK" when the pattern was formed and holes were opened to the bottom, and "NG" when holes did not extend to the bottom. The results are shown in Tables 3 and 4.

Laser Marking Test

The cover film was peeled from the laminate to expose the photosensitive resin layer. The photosensitive resin layer was bonded to a 8-inch silicon wafer by means of a film laminator, after which the PET support film was peeled. The photosensitive resin layer was transferred onto the silicon wafer. The resin layer was dried by heating on a hot plate at 90° C. for 2 minutes. The entire surface of the resin layer was exposed to radiation of wavelength 365 nm in a dose of 800 mJ/cm$^2$ without using a mask. After the exposure, the resin layer was heated at 90° C. for 2 minutes, cooled, and heated at 200° C. for 2 hours for curing. Using a laser marker MD-V9900 (Keyence Corp.), the resin layer was laser marked under irradiation conditions: 1,064 nm, 5 W, and 0.6 second. The sample was rated "OK" when laser marks were visually read and "NG" when no laser marks were read or if imprinted, marks are too thin to read. The results are shown in Tables 3 and 4.

Flexibility Test

The photosensitive resin laminate was wrapped around a plastic cylinder of diameter 8.5 cm, held for 10 seconds, and unwrapped. The laminate was inspected for anomalies. The sample was rated "OK" when unchanged and "NG" when fissured or cracked. The results are shown in Tables 3 and 4.

Transmittance Measurement

Using a spectrophotometer U-3900H (Hitachi High-Tech Science Corp.), the photosensitive resin layer (in the photosensitive resin laminate) was measured for transmittance of light of wavelength 365 nm. The results are shown in Tables 3 and 4.

Physical Properties

The photosensitive resin layer was flood exposed to light, heated in an oven at 90° C. for 2 minutes, and heated again in an oven at 200° C. for 2 hours for curing. Using a viscoelasticity meter DMA7100 (Hitachi High-Tech Science Corp.), the cured film was measured for modulus while it was heated from −10° C. to 320° C. A modulus at 25° C. was read. The results are shown in Tables 3 and 4.

TABLE 3

| Test results | Example | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Patterning | OK | OK | OK | OK | OK | OK | OK | OK | OK | OK | OK | OK | OK | OK | OK | OK |
| Laser marking | OK | OK | OK | OK | OK | OK | OK | OK | OK | OK | OK | OK | OK | OK | OK | OK |
| Modulus (GPa) | 1.60 | 2.42 | 3.11 | 1.80 | 1.64 | 1.89 | 1.27 | 1.55 | 1.79 | 1.68 | 1.73 | 1.65 | 1.65 | 4.34 | 1.61 | 1.93 |
| Flexibility | OK | OK | OK | OK | OK | OK | OK | OK | OK | OK | OK | OK | OK | OK | OK | OK |
| Transmittance @ 365 nm (%) | 29 | 30 | 20 | 29 | 31 | 30 | 29 | 30 | 30 | 31 | 23 | 34 | 29 | 23 | 42 | 38 |

TABLE 4

| Test results | Comparative Example | | | | | | | |
|---|---|---|---|---|---|---|---|---|
| | 1 | 2 | 3 | 4 | 5 | 6 | 7 | 8 |
| Patterning | OK | NG | NG | NG | NG | OK | NG | NG |
| Laser marking | NG | OK | OK | OK | NG | NG | NG | NG |
| Modulus (GPa) | 1.01 | 5.41 | 6.04 | — | 0.41 | 0.50 | 0.23 | 0.25 |
| Flexibility | OK | OK | OK | NG | OK | OK | OK | OK |
| Transmittance @ 365 nm (%) | 66 | 6 | 4 | 3 | 4 | 37 | 28 | 28 |

As seen from the data, the compositions of Examples 1 to 16 exhibit an improved resolution and satisfactory properties as photosensitive material. The cured films have a sufficient modulus.

Japanese Patent Application No. 2018-056546 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising:
   (A) a polyimide silicone containing $1.0 \times 10^{-7}$ to $8.0 \times 10^{-3}$ eq/g of primary alcoholic hydroxyl group,
   (B) a crosslinker,
   (C) a photoacid generator,
   (D) a polyfunctional epoxy compound,
   (E) a filler having an average particle size of 0.01 to 20.0 μm, in an amount of 1 to 70 parts by weight per 100 parts by weight of the polyimide silicone (A), and
   (F) a colorant in an amount of 0.01 to 30 parts by weight per 100 parts by weight of the polyimide silicone (A), wherein the colorant (F) is carbon black.

2. The composition of claim 1, further comprising (G) an organic solvent.

3. The composition of claim 1 wherein the organic solvent is at least one solvent selected from the group consisting of propylene glycol monomethyl ether acetate, propylene glycol monomethyl ether, ethyl lactate, cyclohexanone, cyclopentanone, methyl isobutyl ketone, and γ-butyrolactone.

4. The composition of claim 1 wherein the polyimide silicone (A) comprises recurring units having the formula (1-1) and recurring units having the formula (1-2):

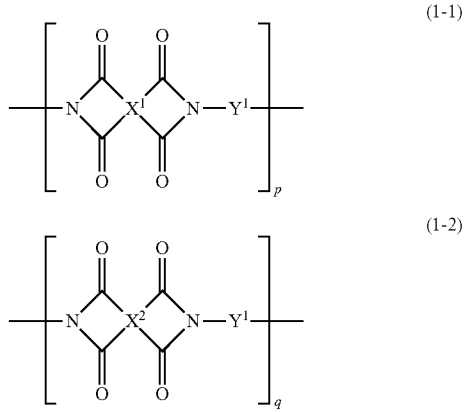

wherein $X^1$ is a tetravalent group having the formula (2):

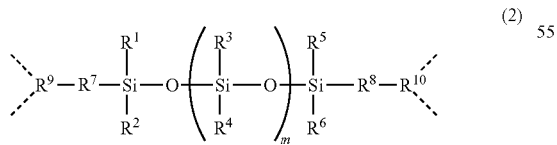

wherein $R^1$ to $R^6$ are each independently a $C_1$-$C_8$ monovalent hydrocarbon group, $R^7$ and $R^8$ are each independently a single bond or $C_1$-$C_{12}$ divalent hydrocarbon group, $R^9$ and $R^{10}$ are each independently a trivalent organic group, m is an integer of 0 to 120, the broken line denotes a valence bond, $Y^1$ is a group having the formula (3):

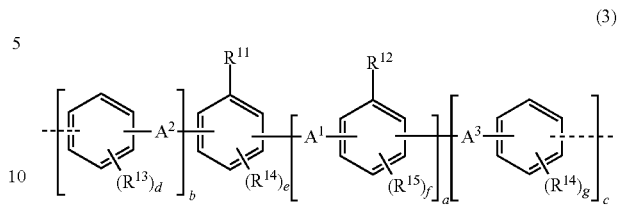

wherein $A^1$ to $A^3$ are each independently a single bond, methylene group, ether bond, sulfonyl group, amide bond, propane-2,2-diyl, 1,1,1,3,3,3-hexafluoropropane-2,2-diyl, or fluorene-9,9-diyl group, $R^{11}$ and $R^{12}$ are each independently a hydroxyl group or alcoholic hydroxyl-containing organic group, at least one of $R^{11}$ and $R^{12}$ being a primary alcoholic hydroxyl-containing organic group, $R^{13}$ to $R^{16}$ are each independently a $C_1$-$C_4$ alkyl group, a is an integer of 0 to 10, b and c are each independently 0 or 1, d to g are each independently 0, 1 or 2, $X^2$ is a tetravalent organic group other than the group of formula (2), p and q are positive integers, meeting $0.01 \leq p/(p+q) < 1$, the broken line denotes a valence bond.

5. The composition of claim 4 wherein $X^2$ is a group selected from the following:

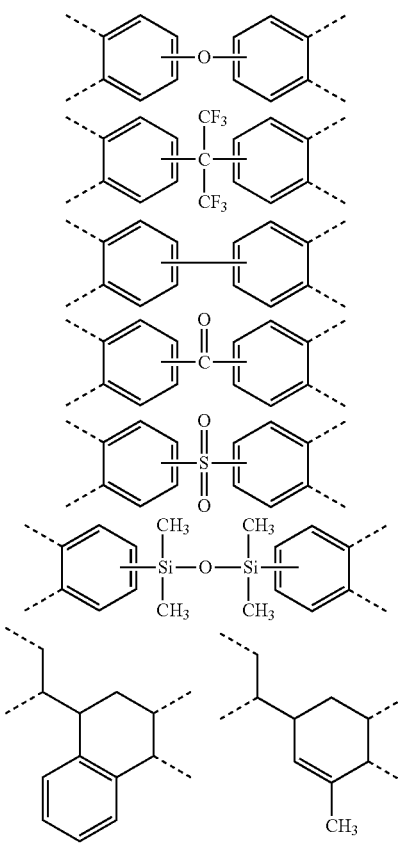

wherein the broken line denotes a valence bond.

6. The composition of claim 1 wherein component (D) comprises at least one compound selected from the group consisting of a bisphenol skeleton-bearing polyfunctional epoxy compound, phenol novolak polyfunctional epoxy compound, and polyfunctional epoxy silicone.

7. A photosensitive resin laminate comprising a support film layer, a photosensitive resin layer composed of the photosensitive resin composition of claim 1, and a cover film layer.

8. A pattern forming process comprising the steps of:
   (i) forming a photosensitive resin film on a substrate using the photosensitive resin composition of claim 1,
   (ii) exposing the resin film to radiation, and
   (iii) developing the resin film in a developer.

9. A pattern forming process comprising the steps of:
   (i) forming a photosensitive resin film on a substrate using the photosensitive resin laminate of claim 7,
   (ii) exposing the resin film to radiation, and
   (iii) developing the resin film in a developer.

* * * * *